US012787809B2

(12) United States Patent
Shih

(10) Patent No.: US 12,787,809 B2
(45) Date of Patent: Nov. 3, 2026

(54) PACKAGE STRUCTURE INCLUDING INACTIVE ELEMENT, ASSEMBLY STRUCTURE AND METHOD OF MANUFACTURING THE SAME

(71) Applicant: NANYA TECHNOLOGY CORPORATION, New Taipei City (TW)

(72) Inventor: Shing-Yih Shih, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 388 days.

(21) Appl. No.: 18/600,997

(22) Filed: Mar. 11, 2024

(65) Prior Publication Data

US 2025/0285982 A1 Sep. 11, 2025

(51) Int. Cl.
*H01L 23/538* (2006.01)
*H10W 70/60* (2026.01)
(Continued)

(52) U.S. Cl.
CPC ........ *H10W 70/611* (2026.01); *H10W 70/635* (2026.01); *H10W 70/685* (2026.01);
(Continued)

(58) Field of Classification Search
CPC ............. H10W 70/611; H10W 70/685; H10W 74/114; H10W 90/00; H10W 70/635
See application file for complete search history.

(56) References Cited

U.S. PATENT DOCUMENTS 5,454,161 A 10/1995 Beilin et al.
2020/0312774 A1* 10/2020 Yu .......................... H10P 72/74
(Continued)

FOREIGN PATENT DOCUMENTS

TW 200618250 A 6/2006
TW 201824412 A 7/2018
(Continued)

OTHER PUBLICATIONS

Office Action and and the search report mailed on Jan. 23, 2025 related to Taiwanese Application No. 113114118.
(Continued)

*Primary Examiner* — William C Trapanese
(74) *Attorney, Agent, or Firm* — Xuan Zhang

(57) ABSTRACT

A package structure, an assembly structure and a manufacturing method are provided. The package structure includes at least one semiconductor device, at least one inactive element and an encapsulant. The at least one inactive element is disposed around the at least one semiconductor device, and includes a main portion and at least one through via extending through the main portion. The encapsulant encapsulates the at least one semiconductor device and the at least one inactive element. A first surface of the encapsulant is substantially coplanar with a first surface of the at least one inactive element and a first surface of the at least one semiconductor device. A second surface of the encapsulant is substantially coplanar with a second surface of the at least one inactive element and a second surface of the at least one semiconductor device.

13 Claims, 26 Drawing Sheets

(51) Int. Cl.
*H10W 70/63* (2026.01)
*H10W 70/685* (2026.01)
*H10W 74/10* (2026.01)
*H10W 90/00* (2026.01)

(52) U.S. Cl.
CPC .......... *H10W 74/114* (2026.01); *H10W 90/00* (2026.01); *H10W 90/794* (2026.01)

(56) References Cited

U.S. PATENT DOCUMENTS

| | | | | |
|---|---|---|---|---|
| 2022/0157680 | A1* | 5/2022 | Shanmugam | H05K 1/0278 |
| 2022/0157732 | A1 | 5/2022 | Tsai et al. | |
| 2022/0165648 | A1* | 5/2022 | Kim | H10P 72/74 |
| 2023/0245974 | A1 | 8/2023 | Gomes et al. | |
| 2024/0071940 | A1 | 2/2024 | Agarwal et al. | |

FOREIGN PATENT DOCUMENTS

| | | | |
|---|---|---|---|
| TW | 202221873 | A | 6/2022 |
| TW | 202230549 | A | 8/2022 |
| TW | I823582 | B | 11/2023 |

OTHER PUBLICATIONS

Summary translation of Office Action and and the search report mailed on Jan. 23, 2025 related to Taiwanese Application No. 113114118.

Office Action and and the search report mailed on Jan. 16, 2026 related to Taiwanese Application No. 114101019.

Summary translation of Office Action and and the search report mailed on Jan. 16, 2026 related to Taiwanese Application No. 114101019.

* cited by examiner

PACKAGE STRUCTURE INCLUDING INACTIVE ELEMENT, ASSEMBLY STRUCTURE AND METHOD OF MANUFACTURING THE SAME

TECHNICAL FIELD

The present disclosure relates to a package structure, an assembly structure and a method of manufacturing the same, and more particularly, to a package structure including at least one inactive element, an assembly structure including the package structure, and a method of manufacturing the same.

DISCUSSION OF THE BACKGROUND

Semiconductor electronic devices are widely used in various electronic applications, and their dimensions are constantly being reduced to meet the demands of current applications. However, scaling down semiconductor electronic devices presents several challenges that affect their final electrical characteristics, quality, cost, and yield. As semiconductor electronic devices become smaller, they require multifunctional and high-volume data processing capabilities. Consequently, there is an increasing need to enhance the integration level of semiconductor devices used in these electronic devices. However, due to the limitations of semiconductor integration technology, it is challenging to meet all the required functions with just a single semiconductor chip. To address this issue, semiconductor packages have been developed, which involve including multiple semiconductor chips.

This Discussion of the Background section is provided for background information only. The statements in this Discussion of the Background are not an admission that the subject matter disclosed herein constitutes prior art with respect to the present disclosure, and no part of this Discussion of the Background may be used as an admission that any part of this application constitutes prior art with respect to the present disclosure.

SUMMARY

One aspect of the present disclosure provides a package structure including a first molded structure, a first redistribution structure and a second redistribution structure. The first molded structure has a first surface and a second surface opposite to the first surface, and includes at least one semiconductor device, at least one inactive element and an encapsulant. The at least one inactive element is disposed around the at least one semiconductor device, and includes a main portion and at least one through via extending through the main portion. The encapsulant encapsulates the at least one semiconductor device and the at least one inactive element. The first redistribution structure is disposed on the first surface of the first molded structure. The second redistribution structure is disposed on the second surface of the first molded structure, and is electrically connected to the first redistribution structure through the at least one through via of the at least one inactive element.

Another aspect of the present disclosure provides an assembly structure including a substrate, a first molded structure, a second molded structure and an upper electronic device. The first molded structure is disposed over the substrate. The first molded structure includes at least one semiconductor device, at least one inactive element and an encapsulant encapsulating the at least one semiconductor device and the at least one inactive element. The second molded structure is disposed between the first molded structure and the substrate. The second molded structure includes at least one semiconductor device, at least one inactive element and an encapsulant encapsulating the at least one semiconductor device and the at least one inactive element. The upper electronic device is disposed over the first molded structure. The at least one inactive element of the first molded structure and the at least one inactive element of the second molded structure are configured to provide a vertical conduction path between the upper electronic device and the substrate.

Another aspect of the present disclosure provides a manufacturing method. The manufacturing method includes: forming a first molded structure on a first carrier; disposing an upper electronic device on the first molded structure; removing the first carrier; forming a second molded structure on a second carrier; attaching the upper electronic device and the first molded structure to the second molded structure; and removing the second carrier.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRA WINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
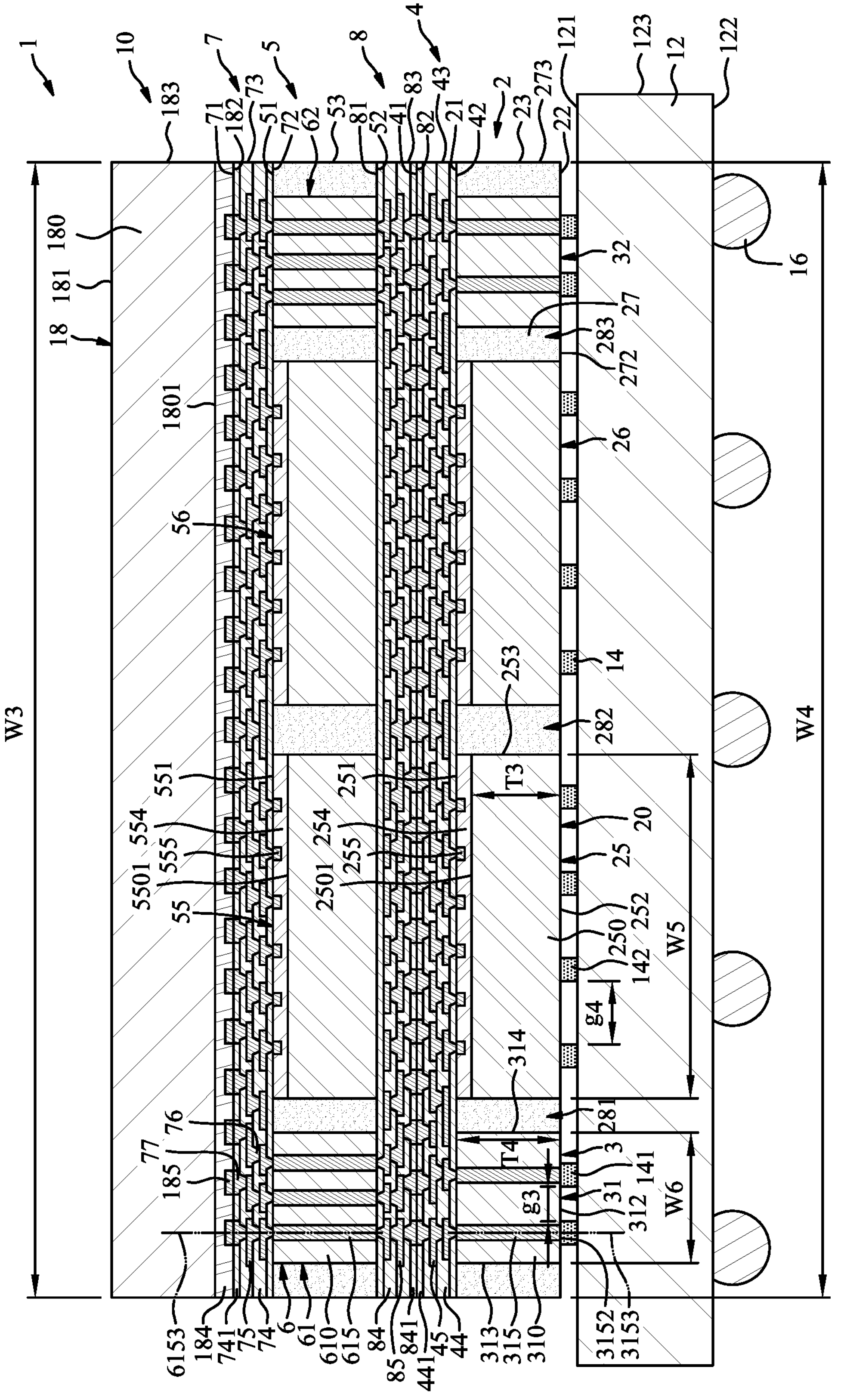
FIG. 1 is a schematic cross-sectional view of an assembly structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc., may be used herein to describe various elements, components, regions, layers or sections, these elements, components, regions, layers or sections are not limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

Figure 2:
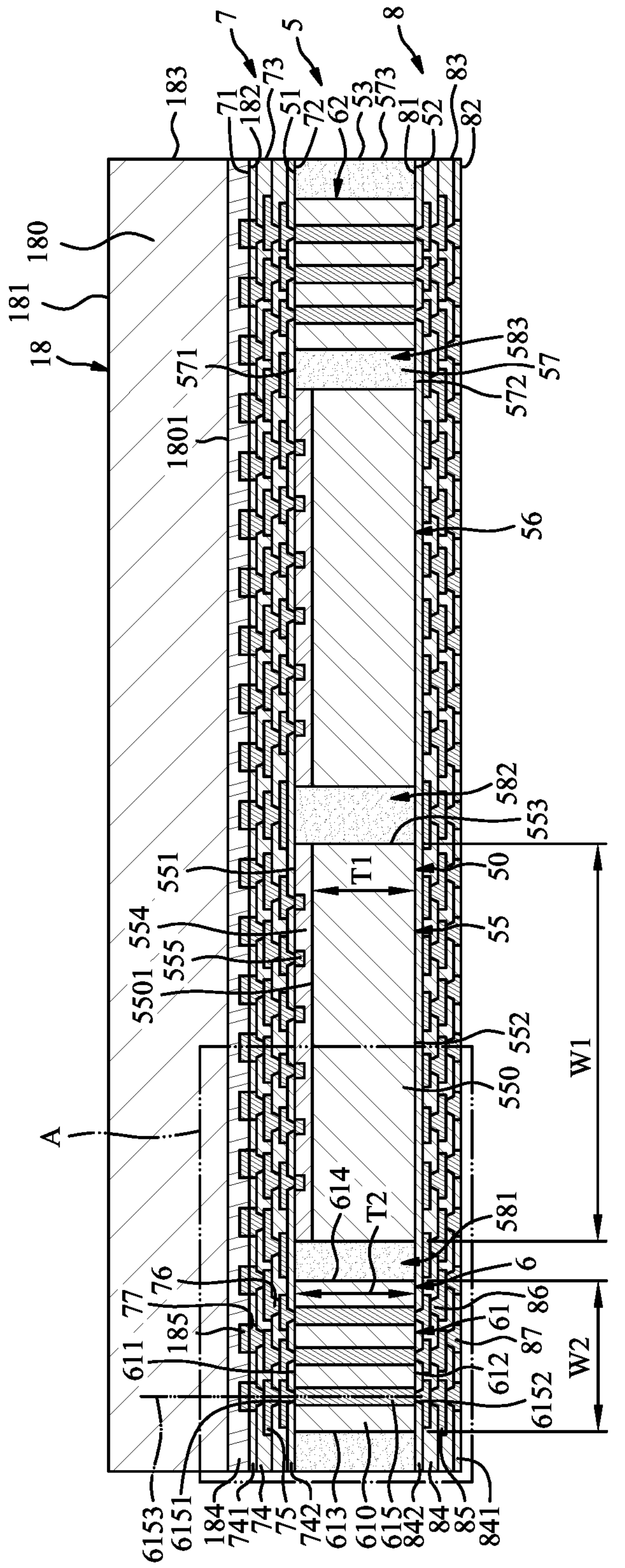
FIG. 2 is a partial view of an upper portion of the assembly structure of FIG. 1.
Figure 3:
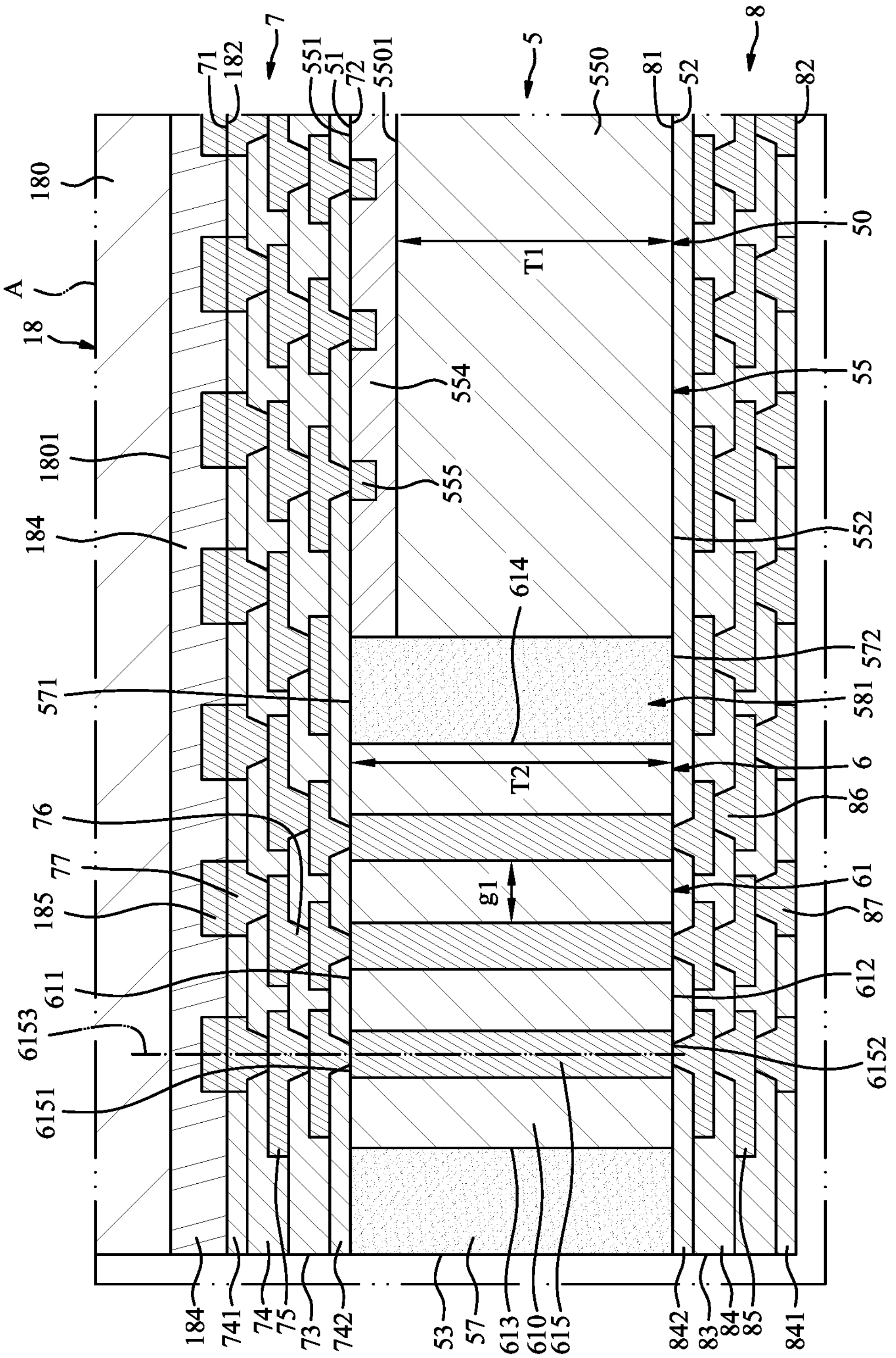
FIG. 3 is an enlarged view of an area "A" of FIG. 2.
Figure 4:
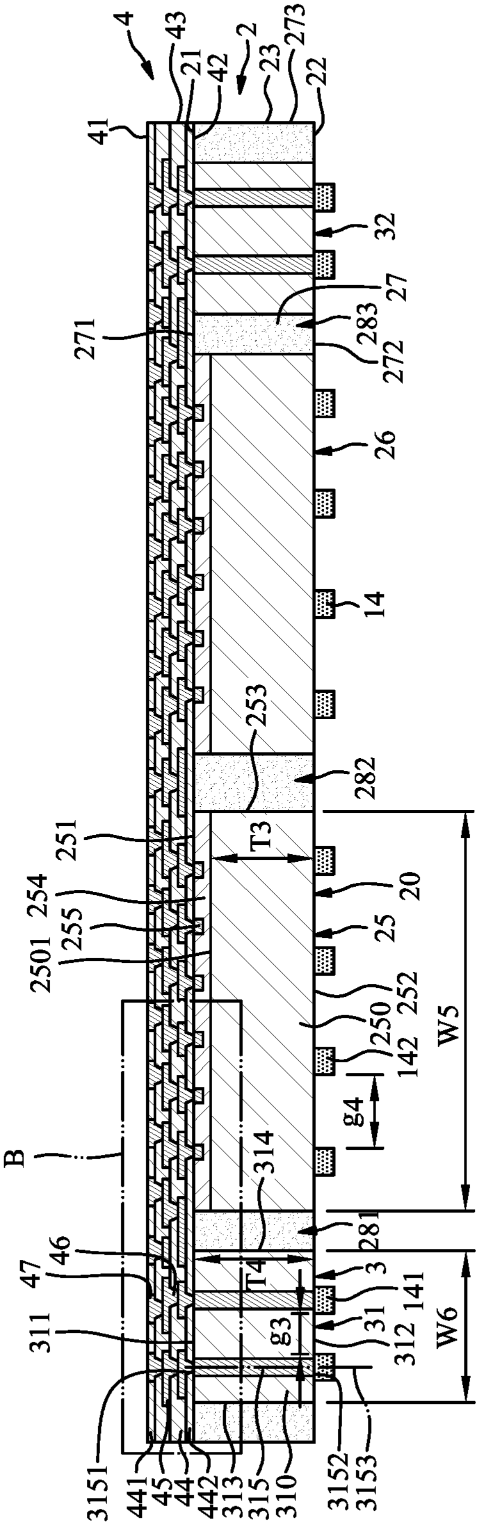
FIG. 4 is a partial view of a lower portion of the assembly structure of FIG. 1.
Figure 5:
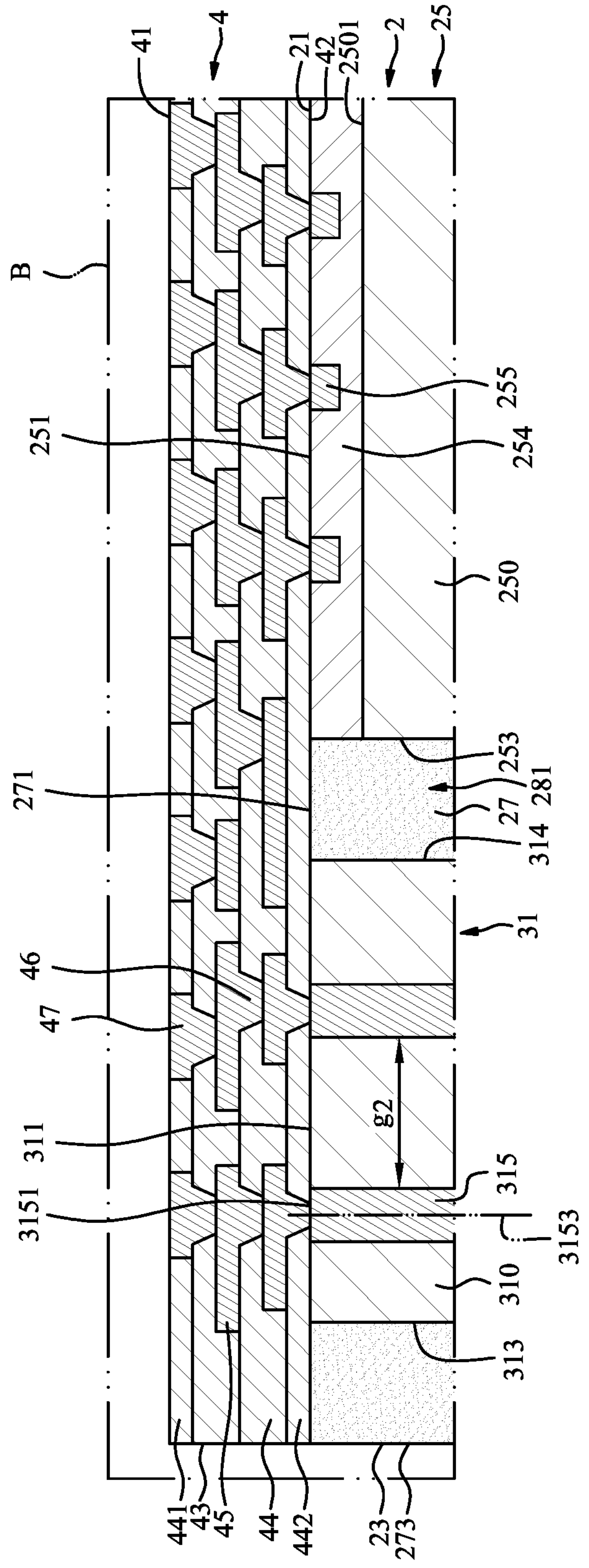
FIG. 5 is an enlarged view of an area "B" of FIG. 4.

FIG. 1 is a schematic cross-sectional view of an assembly structure 1 in accordance with some embodiments of the present disclosure. FIG. 2 is a partial view of an upper portion of the assembly structure 1 of FIG. 1. FIG. 3 is an enlarged view of an area "A" of FIG. 2. FIG. 4 is a partial view of a lower portion of the assembly structure 1 of FIG. 1. FIG. 5 is an enlarged view of an area "B" of FIG. 4. In some embodiments, the assembly structure 1 may be a semiconductor electronic device, a semiconductor electronic structure or a package structure. In some embodiments, the assembly structure 1 may include a package structure 10, a substrate 12, a plurality of bumps 14 and a plurality of external connectors 16.

The substrate 12 may be a semiconductor substrate, and may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the substrate 12 may include a semiconductor-on-insulator substrate, such as a silicon-on-insulator (SOI) substrate, a silicon germanium-on-insulator (SGOI) substrate, or a germanium-on-insulator (GOI) substrate. In some embodiments, the substrate 12 may include organic material, glass, ceramic material or the like. For example, the substrate 12 may be made of a cured photoimageable dielectric (PID) material such as epoxy or polyimide (PI) including photoinitiators. For example, the substrate 12 may include a homogeneous material. For example, the material of the substrate 12 may include epoxy type FR5, FR4, Bismaleimide triazine (BT), print circuit board (PCB) material, Prepreg (PP), Ajinomoto build-up film (ABF) or other suitable materials.

The substrate 12 may have a first surface 121 (e.g., a top surface), a second surface 122 (e.g., a bottom surface) and a lateral surface 123. The second surface 122 (e.g., the bottom surface) may be opposite to the first surface 121 (e.g., the top surface). The lateral surface 123 may extend between the first surface 121 (e.g., the top surface) and the second surface 122 (e.g., the bottom surface).

The package structure 10 may be disposed over the first surface 121 of the substrate 12, and may be attached to the first surface 121 of the substrate 12 through the bumps 14. The external connectors 16 may be disposed on the second surface 122 of the substrate 12 to provide electrical connections, for example, I/O connections, of the substrate 12. Each of the external connector 16 may include a reflowable material such as a solder ball.

The package structure 10 may include a first molded structure 5, a first redistribution structure 7, a second redistribution structure 8, a second molded structure 2, a third redistribution structure 4 and an upper electronic device 18.

The first molded structure 5 may be disposed over and electrically connected to the substrate 12. The first molded structure 5 may have a first surface 51 (e.g., a top surface), a second surface 52 (e.g., a bottom surface) and a lateral surface 53. The second surface 52 (e.g., the bottom surface) may be opposite to the first surface 51 (e.g., the top surface). The lateral surface 53 may extend between the first surface 51 (e.g., the top surface) and the second surface 52 (e.g., the bottom surface).

Referring to FIG. 1 to FIG. 3, the first molded structure 5 may include at least one semiconductor device 50, at least one inactive element 6 and an encapsulant 57. The semiconductor device 50 may include a semiconductor die or a chip, such as a memory die (e.g., dynamic random access memory (DRAM) die, static random access memory (SRAM) die, etc.). The semiconductor device 50 may include a first semiconductor device 55 and a second semiconductor device 56 disposed side by side. In some embodiments, the size and the function of the first semiconductor device 55 may be same as the size and the function of the second semiconductor device 56. The structure of the first semiconductor device 55 may be same as the structure of the second semiconductor device 56. Both of the first semiconductor device 55 and the second semiconductor device 56 may be memory dice.

The first semiconductor device 55 may have a first surface 551 (e.g., a top surface or an active surface), a second surface 552 (e.g., a bottom surface or a backside surface) and a lateral surface 553. The second surface 552 (e.g., the bottom surface) may be opposite to the first surface 551 (e.g., the top surface). The lateral surface 553 may extend between the first surface 551 (e.g., the top surface) and the second surface 552 (e.g., the bottom surface).

The first semiconductor device 55 may include a main portion 550 and an active circuit structure 554 disposed on a top surface 5501 of the main portion 550. A material of the main portion 550 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The active circuit structure 554 may include a plurality of dielectric layers, a plurality of circuit layers and a plurality of pads 555. The dielectric layers may cover the circuit layers. The pads 555 may be electrically connected to the circuit layers, and embedded in the dielectric layers. The pads 555 may be exposed from the first surface 551 of the first semiconductor device 55.

The inactive element 6 may be disposed around the semiconductor device 50 (including, e.g., the first semiconductor device 55 and the second semiconductor device 56). The inactive element 6 may be also referred to as "a dummy die". The inactive element 6 may include a first inactive element 61 and a second inactive element 62 disposed around the first semiconductor device 55 and the second semiconductor device 56. A structure of the first inactive element 61 may be same as or similar to a structure of the second inactive element 62.

The first inactive element 61 may have a first surface 611 (e.g., a top surface), a second surface 612 (e.g., a bottom surface) and two lateral surfaces 613, 614. The second surface 612 (e.g., the bottom surface) may be opposite to the first surface 611 (e.g., the top surface). The lateral surfaces 613, 614 may extend between the first surface 611 (e.g., the top surface) and the second surface 612 (e.g., the bottom surface).

The first inactive element 61 may include a main portion 610 and at least one through via 615 (or through silicon via (TSV)) extending through the main portion 610. The main portion 610 may have a first surface 611 (e.g., a top surface), a second surface 612 (e.g., a bottom surface) and two lateral surfaces 613, 614. The second surface 612 (e.g., the bottom surface) may be opposite to the first surface 611 (e.g., the top surface). The lateral surfaces 613, 614 may extend between the first surface 611 (e.g., the top surface) and the second surface 612 (e.g., the bottom surface). Thus, the first surface 611, the second surface 612 and the lateral surfaces 613, 614 of the first inactive element 61 may be the first surface 611, the second surface 612 and the lateral surfaces 613, 614 of the main portion 610, respectively.

A material of the main portion 610 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the material of the main portion 550 of the first semiconductor device 55 may be same as the material of the main portion 610 of the first inactive element 61.

A width W1 of the first semiconductor device 55 (or the main portion 550) may be greater than a width W2 of the first inactive element 61 (or the main portion 610). A thickness T1 of the main portion 550 of the first semiconductor device 55 may be less than a thickness T2 of the main portion 610 of the first inactive element 61.

The semiconductor device 50 (including, e.g., the first semiconductor device 55 and the second semiconductor device 56) does not include a vertical conduction path in the main portion thereof. That is, the semiconductor device 50 (including, e.g., the first semiconductor device 55 and the second semiconductor device 56) may be free of a vertical conduction path to the substrate 12. For example, the first semiconductor device 55 does not include a vertical conduction path in the main portion 550 thereof.

The first inactive element 61 may include a plurality of through vias 615. A gap g1 may be formed between adjacent two of the through vias 615. Each of the through vias 615 may have a central axis 6153.

The through via 615 of the first inactive element 61 may have a first surface 6151 (e.g., a top surface) and a second surface 6152 (e.g., a bottom surface) opposite to the first surface 6151 (e.g., the top surface). The first surface 6151 of the first through via 615 of the first inactive element 61 may be substantially coplanar with and exposed from the first surface 611 of the first inactive element 61. The second surface 6152 of the through via 615 of the first inactive element 61 may be substantially coplanar with and exposed from the second surface 612 of the first inactive element 61. That is, the through via 615 of the first inactive element 61 may extend from the first surface 611 of the main portion 610 to the second surface 612 of the main portion 610.

Thus, the through via 615 of the first inactive element 61 may provide a vertical conduction path extending through the main portion 610 of the first inactive element 61, and may be configured to transmit signals or power. Thus, the first redistribution structure 7 and the upper electronic device 18 may be electrically connected to the second redistribution structure 8 and the substrate 12 through the through via 615 of the first inactive element 61 rather than through the semiconductor device 50 (including, e.g., the first semiconductor device 55 and the second semiconductor device 56). There is no need to form a through via in the main portion (e.g., the main portion 550) of the semiconductor device 50 (e.g., the first semiconductor device 55 and the second semiconductor device 56).

In some embodiments, the inactive element 6 does not include a horizontal conduction path (e.g., a horizontal circuit layer) on the main portion thereof. For example, the first inactive element 61 does not include a horizontal conduction path (e.g., a horizontal circuit layer) on the main portion 610 thereof. There is no horizontal conduction path on the first surface 611 of the main portion 610 nor on the second surface 612 of the main portion 610. The inactive element 6 only include the vertical conduction path.

The encapsulant 57 may encapsulate the semiconductor device 50 (including, e.g., the first semiconductor device 55 and the second semiconductor device 56) and the inactive element 6 (including, e.g., the first inactive element 61 and the second inactive element 62). For example, the encapsulant 57 may be disposed in a space 581 between the first semiconductor device 55 and the first inactive element 61, in a space 582 between the first semiconductor device 55 and the second semiconductor device 56, and in a space 583 between the second semiconductor device 56 and the second inactive element 62. A material of the encapsulant 57 may include a molding compound with or without fillers.

The encapsulant 57 may have a first surface 571 (e.g., a top surface), a second surface 572 (e.g., a bottom surface) and a lateral surface 573. The second surface 572 (e.g., the bottom surface) may be opposite to the first surface 571 (e.g., the top surface). The lateral surface 573 may extend between the first surface 571 (e.g., the top surface) and the second surface 572 (e.g., the bottom surface).

The first surface 571 of the encapsulant 57 may be substantially coplanar with or aligned with the first surface 611 of the first inactive element 61 and the first surface 551 of the first semiconductor device 55. Thus, the first surface 51 of the first molded structure 5 may include the first surface 571 of the encapsulant 57, the first surface 611 of the first inactive element 61 and the first surface 551 of the first semiconductor device 55. In addition, the second surface 572 of the encapsulant 57 may be substantially coplanar with or aligned with the second surface 612 of the first inactive element 61 and the second surface 552 of the first semiconductor device 55. Thus, the second surface 52 of the first molded structure 5 may include the second surface 572 of the encapsulant 57, the second surface 612 of the first inactive element 61 and the second surface 552 of the first semiconductor device 55.

The first redistribution structure 7 may be disposed on and electrically connected to the first surface 51 of the first molded structure 5. For example, the first redistribution structure 7 may be disposed on the first surface 571 of the encapsulant 57, the first surface 611 of the first inactive element 61 and the first surface 551 of the first semiconductor device 55, and electrically connected to the first semiconductor device 55 and the through via 615 of the first inactive element 61.

The first redistribution structure 7 may be a fan-out structure. The first redistribution structure 7 may have a first surface 71 (e.g., a top surface), a second surface 72 (e.g., a bottom surface) and a lateral surface 73. The second surface 72 (e.g., the bottom surface) may be opposite to the first surface 71 (e.g., the top surface). The lateral surface 73 may extend between the first surface 71 (e.g., the top surface) and the second surface 72 (e.g., the bottom surface). The second surface 72 of the first redistribution structure 7 may contact the first surface 51 of the first molded structure 5 directly.

The first redistribution structure 7 may include a plurality of dielectric layers 74, a plurality of circuit layers 75, a plurality of inner vias 76 and a plurality of pads 77. The dielectric layers 74 may be made of a cured photoimageable dielectric (PID) material such as epoxy or polyimide (PI) including photoinitiators. The material of the dielectric layers 74 may be the same with each other. In some embodiments, the material of the topmost dielectric layer 741 may be different from the material of the other dielectric layers 74. The topmost dielectric layer 741 may be a hybrid bonding (HB) dielectric layer, and may include $SiO_2$, SiCN and/or SiON. In some embodiments, the bottommost dielectric layer 742 may be omitted. The circuit layers 75 may be disposed on the first surface 51 of the first molded structure 5 directly.

The circuit layers 75 may be covered by or embedded in the dielectric layers 74. The circuit layers 75 may be fan-out circuit layers. The inner vias 76 may be embedded in the dielectric layers 74, and may connect adjacent two of the circuit layers 75. The inner vias 76 may taper toward the first molded structure 5. The pads 77 may be electrically connected to the circuit layers 75, and embedded in the dielectric layers 74 (e.g., the topmost dielectric layer 741). The pads 77 may be exposed from the first surface 71 of the first redistribution structure 7. Each of the pads 77 may be a hybrid bonding (HB) pad, and may include Cu or Al.

The second redistribution structure 8 may be disposed on and electrically connected to the second surface 52 of the first molded structure 5. For example, the second redistribution structure 8 may be disposed on the second surface 572 of the encapsulant 57, the second surface 612 of the first inactive element 61 and the second surface 552 of the first semiconductor device 55, and electrically connected to the through via 615 of the first inactive element 61.

The second redistribution structure 8 may be a fan-out structure. The second redistribution structure 8 may have a first surface 81 (e.g., a top surface), a second surface 82 (e.g., a bottom surface) and a lateral surface 83. The second surface 82 (e.g., the bottom surface) may be opposite to the first surface 81 (e.g., the top surface). The lateral surface 83 may extend between the first surface 81 (e.g., the top surface) and the second surface 82 (e.g., the bottom surface). The first surface 81 of the second redistribution structure 8 may contact the second surface 52 of the first molded structure 5 directly.

The second redistribution structure 8 may include a plurality of dielectric layers 84, a plurality of circuit layers 85, a plurality of inner vias 86 and a plurality of pads 87. The dielectric layers 84 may be made of a cured photoimageable dielectric (PID) material such as epoxy or polyimide (PI) including photoinitiators. The material of the dielectric layers 84 may be the same with each other. In some embodiments, the material of the bottommost dielectric layer 841 may be different from the material of the other dielectric layers 84. The bottommost dielectric layer 841 may be a hybrid bonding (HB) dielectric layer, and may include $SiO_2$, SiCN and/or SiON. In some embodiments, the topmost dielectric layer 842 may be omitted. The circuit layers 85 may be disposed on the second surface 52 of the first molded structure 5 directly.

The circuit layers 85 may be covered by or embedded in the dielectric layers 84. The circuit layers 85 may be fan-out circuit layers. The inner vias 86 may be embedded in the dielectric layers 84, and may connect adjacent two of the circuit layers 85. The inner vias 86 may taper toward the first molded structure 5. The pads 77 may be electrically connected to the circuit layers 75, and embedded in the dielectric layers 84 (e.g., the bottommost dielectric layer 841). The pads 87 may be exposed from the second surface 82 of the second redistribution structure 8. Each of the pads 87 may be a hybrid bonding (HB) pad, and may include Cu or Al.

The upper electronic device 18 may be disposed over and electrically connected to the first surface 71 of the first redistribution structure 7. The upper electronic device 18 may be also disposed over and electrically connected to the first surface 51 of the first molded structure 5 (including, e.g., the first surface 571 of the encapsulant 57, the first surface 611 of the first inactive element 61 and the first surface 551 of the first semiconductor device 55).

The upper electronic device 18 may include a semiconductor die or a chip, such as a signal processing die (e.g., digital signal processing (DSP) die), a logic die (e.g., application processor (AP), system-on-a-chip (SoC), central processing unit (CPU), graphics processing unit (GPU), microcontroller, etc.), a radio frequency (RF) die, a sensor die, a micro-electro-mechanical-system (MEMS) die, a front-end die (e.g., analog front-end (AFE) dies) or other active components.

The upper electronic device 18 may have a first surface 181 (e.g., a top surface or a backside surface), a second surface 182 (e.g., a bottom surface or an active surface) and a lateral surface 183. The second surface 182 (e.g., the bottom surface) may be opposite to the first surface 181 (e.g., the top surface). The lateral surface 183 may extend between the first surface 181 (e.g., the top surface) and the second surface 182 (e.g., the bottom surface).

The upper electronic device 18 may include a main portion 180 and an active circuit structure 184 disposed on a bottom surface 1801 of the main portion 180. A material of the main portion 180 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The active circuit structure 184 may include a plurality of dielectric layers, a plurality of circuit layers and a plurality of pads 185. The dielectric layers may cover the circuit layers. The pads 185 may be electrically connected to the circuit layers, and embedded in the dielectric layers. The pads 185 may be exposed from the second surface 182 of the upper electronic device 18. The active circuit structure 184 may include a bottommost dielectric layer surrounding the pads 185. The bottommost dielectric layer may be a hybrid bonding (HB) dielectric layer, and may include $SiO_2$, SiCN and/or SiON. Each of the pads 185 may be a hybrid bonding (HB) pad, and may include Cu or Al.

The upper electronic device 18 may be attached to and electrically connected to the first surface 71 of the first redistribution structure 7 by hybrid bonding. That is, the second surface 182 of the upper electronic device 18 may contact the first surface 71 of the first redistribution structure 7 directly. Thus, the active circuit structure 184 of the upper electronic device 18 may be attached to, may connect to and may contact the topmost dielectric layer 741 of the first redistribution structure 7 directly. The pads 185 of the upper electronic device 18 may be attached to, may connect to and may contact the pads 77 of the first redistribution structure 7 directly.

The size and the function of the upper electronic device 18 may be different from the size and the function of the semiconductor device 50 (including, e.g., the first semiconductor device 55 and the second semiconductor device 56) of the first molded structure 5 and the size and the function of the semiconductor device 20 (including, e.g., the first semiconductor device 25 and the second semiconductor device 26) of the second molded structure 2.

A width W3 of the upper electronic device 18 may be substantially equal to a width W4 of the first molded structure 5 (or a width W4 of the encapsulant 57) and a width W4 of the second molded structure 2 (or a width W4 of the encapsulant 27). The lateral surface 183 of the upper electronic device 18 may be substantially aligned with the lateral surface 53 of the first molded structure 5 (or the lateral surface 573 of the encapsulant 57) and a lateral surface 23 of the second molded structure 2 (or the lateral surface 273 of the encapsulant 27). The upper electronic device 18 may vertically overlap the inactive element 6 (including, e.g., the first inactive element 61 and the second inactive element 62).

Referring to FIG. 1, FIG. 4 and FIG. 5, the second molded structure 2 may be disposed over and electrically connected to the substrate 12. The second molded structure 2 may be disposed under the first molded structure 5. The second molded structure 2 may have a first surface 21 (e.g., a top surface), a second surface 22 (e.g., a bottom surface) and a lateral surface 23. The second surface 22 (e.g., the bottom surface) may be opposite to the first surface 21 (e.g., the top surface). The lateral surface 23 may extend between the first surface 21 (e.g., the top surface) and the second surface 22 (e.g., the bottom surface).

The second molded structure 2 may include at least one semiconductor device 20, at least one inactive element 3 and an encapsulant 27. The semiconductor device 20 may include a semiconductor die or a chip, such as a memory die (e.g., dynamic random access memory (DRAM) die, static random access memory (SRAM) die, etc.). The semiconductor device 20 may include a first semiconductor device 25 and a second semiconductor device 26 disposed side by side. In some embodiments, the size and the function of the first semiconductor device 25 may be same as the size and the function of the second semiconductor device 26. Both of the first semiconductor device 25 and the second semiconductor device 26 may be memory dice.

The first semiconductor device 25 may have a first surface 251 (e.g., a top surface or an active surface), a second surface 252 (e.g., a bottom surface or a backside surface) and a lateral surface 253. The second surface 252 (e.g., the bottom surface) may be opposite to the first surface 251 (e.g., the top surface). The lateral surface 253 may extend between the first surface 251 (e.g., the top surface) and the second surface 252 (e.g., the bottom surface).

The first semiconductor device 25 may include a main portion 250 and an active circuit structure 254 disposed on a top surface 2501 of the main portion 250. A material of the main portion 250 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials.

The active circuit structure 254 may include a plurality of dielectric layers, a plurality of circuit layers and a plurality of pads 255. The dielectric layers may cover the circuit layers. The pads 255 may be electrically connected to the circuit layers, and embedded in the dielectric layers. The pads 255 may be exposed from the first surface 251 of the first semiconductor device 25.

The inactive element 3 may be disposed around the semiconductor device 20 (including, e.g., the first semiconductor device 25 and the second semiconductor device 26). The inactive element 3 may be also referred to as "a dummy die". The inactive element 3 may include a first inactive element 31 and a second inactive element 32 disposed around the first semiconductor device 25 and the second semiconductor device 26. A structure of the first inactive element 31 may be same as or similar to a structure of the second inactive element 32.

The first inactive element 31 may have a first surface 311 (e.g., a top surface), a second surface 312 (e.g., a bottom surface) and two lateral surfaces 313, 314. The second surface 312 (e.g., the bottom surface) may be opposite to the first surface 311 (e.g., the top surface). The lateral surfaces 313, 314 may extend between the first surface 311 (e.g., the top surface) and the second surface 312 (e.g., the bottom surface).

The first inactive element 31 may include a main portion 310 and at least one through via 315 (or through silicon via (TSV)) extending through the main portion 310. The main portion 310 may have a first surface 311 (e.g., a top surface), a second surface 312 (e.g., a bottom surface) and two lateral surfaces 313, 314. The second surface 312 (e.g., the bottom surface) may be opposite to the first surface 311 (e.g., the top surface). The lateral surfaces 313, 314 may extend between the first surface 311 (e.g., the top surface) and the second surface 312 (e.g., the bottom surface). Thus, the first surface 311, the second surface 312 and the lateral surfaces 313, 314 of the first inactive element 31 may be the first surface 311, the second surface 312 and the lateral surfaces 313, 314 of the main portion 310, respectively.

A material of the main portion 310 may include, for example, silicon (Si), doped silicon, germanium (Ge), silicon germanium (SiGe), silicon carbide (SiC), silicon germanium carbide (SiGeC), gallium (Ga), gallium arsenide (GaAs), indium (In), indium arsenide (InAs), indium phosphide (InP) or other IV-IV, III-V or II-VI semiconductor materials. In some embodiments, the material of the main portion 250 of the first semiconductor device 25 may be same as the material of the main portion 310 of the first inactive element 31.

A width W5 of the first semiconductor device 25 (or the main portion 250) may be greater than a width W6 of the first inactive element 31 (or the main portion 310). The width W6 of the first inactive element 31 (or the main portion 310) of the second molded structure 2 may be equal to or different from the width W2 of the first inactive element 61 (or the main portion 610) of the first molded structure 5. A thickness T3 of the main portion 250 of the first semiconductor device 25 may be less than a thickness T4 of the main portion 310 of the first inactive element 31. The thickness T4 of the main portion 310 of the first inactive element 31 of the second molded structure 2 may be equal to or different from the thickness T2 of the main portion 610 of the first inactive element 61 of the first molded structure 5.

The semiconductor device 20 (including, e.g., the first semiconductor device 25 and the second semiconductor device 26) does not include a vertical conduction path in the main portion thereof. That is, the semiconductor device 20 (including, e.g., the first semiconductor device 25 and the second semiconductor device 26) may be free of a vertical conduction path to the substrate 12. For example, the first semiconductor device 25 does not include a vertical conduction path in the main portion 250 thereof.

The first inactive element 31 may include a plurality of through vias 315. A gap g2 may be formed between adjacent two of the through vias 315. Each of the through vias 315 may have a central axis 3153. In some embodiments, the gap g1 between adjacent two of the through vias 615 of the first molded structure 5 may be different from or less than the gap g2 between adjacent two of the through vias 315 of the second molded structure 2. In some embodiments, a central axis 6153 of one of the through vias 615 of the first molded structure 5 may be substantially aligned with a central axis 3153 of one of the through vias 315 of the second molded structure 2. In some embodiments, all of the central axes 6153 of all of the through vias 615 of the first molded structure 5 may be aligned with or misaligned with all of the central axes 3153 of all of the through vias 315 of the second molded structure 2.

The through via 315 of the first inactive element 31 may have a first surface 3151 (e.g., a top surface) and a second surface 3152 (e.g., a bottom surface) opposite to the first surface 3151 (e.g., the top surface). The first surface 3151 of the first through via 315 of the first inactive element 31 may be substantially coplanar with and exposed from the first surface 311 of the first inactive element 31. The second surface 3152 of the through via 315 of the first inactive element 31 may be substantially coplanar with and exposed from the second surface 312 of the first inactive element 31. That is, the through via 315 of the first inactive element 31 may extend from the first surface 311 of the main portion 310 to the second surface 312 of the main portion 310.

Thus, the through via 315 of the first inactive element 31 may provide a vertical conduction path extending through the main portion 310 of the first inactive element 31, and may be configured to transmit signals or power. Thus, the third redistribution structure 4 may be electrically connected to the substrate 12 through the through via 315 of the first inactive element 31 rather than through the semiconductor device 20 (including, e.g., the first semiconductor device 25 and the second semiconductor device 26). There is no need to form a through via in the main portion (e.g., the main portion 250) of the semiconductor device 20 (e.g., the first semiconductor device 25 and the second semiconductor device 26).

In some embodiments, the inactive element 3 does not include a horizontal conduction path (e.g., a horizontal circuit layer) on the main portion thereof. For example, the first inactive element 31 does not include a horizontal conduction path (e.g., a horizontal circuit layer) on the main portion 310 thereof. There is no horizontal conduction path on the first surface 311 of the main portion 310 nor on the second surface 312 of the main portion 310. The inactive element 3 only include the vertical conduction path.

The encapsulant 27 may encapsulate the semiconductor device 20 (including, e.g., the first semiconductor device 25 and the second semiconductor device 26) and the inactive element 3 (including, e.g., the first inactive element 31 and the second inactive element 32). For example, the encapsulant 27 may be disposed in a space 281 between the first semiconductor device 25 and the first inactive element 31, in a space 282 between the first semiconductor device 25 and the second semiconductor device 26, and in a space 283 between the second semiconductor device 26 and the second inactive element 32. A material of the encapsulant 27 may include a molding compound with or without fillers.

The encapsulant 27 may have a first surface 271 (e.g., a top surface), a second surface 272 (e.g., a bottom surface) and a lateral surface 273. The second surface 272 (e.g., the bottom surface) may be opposite to the first surface 271 (e.g., the top surface). The lateral surface 273 may extend between the first surface 271 (e.g., the top surface) and the second surface 272 (e.g., the bottom surface).

The first surface 271 of the encapsulant 27 may be substantially coplanar with or aligned with the first surface 311 of the first inactive element 31 and the first surface 251 of the first semiconductor device 25. Thus, the first surface 21 of the second molded structure 2 may include the first surface 271 of the encapsulant 27, the first surface 311 of the first inactive element 31 and the first surface 251 of the first semiconductor device 25. In addition, the second surface 272 of the encapsulant 27 may be substantially coplanar with or aligned with the second surface 312 of the first inactive element 31 and the second surface 252 of the first semiconductor device 25. Thus, the second surface 22 of the second molded structure 2 may include the second surface 272 of the encapsulant 27, the second surface 312 of the first inactive element 31 and the second surface 252 of the first semiconductor device 25.

The third redistribution structure 4 may be disposed on and electrically connected to the first surface 21 of the second molded structure 2. For example, the third redistribution structure 4 may be disposed on the first surface 271 of the encapsulant 27, the first surface 311 of the first inactive element 31 and the first surface 251 of the first semiconductor device 25, and electrically connected to the first semiconductor device 25 and the through via 315 of the first inactive element 31.

The third redistribution structure 4 may be a fan-out structure. The third redistribution structure 4 may have a first surface 41 (e.g., a top surface), a second surface 42 (e.g., a bottom surface) and a lateral surface 43. The second surface 42 (e.g., the bottom surface) may be opposite to the first surface 41 (e.g., the top surface). The lateral surface 43 may extend between the first surface 41 (e.g., the top surface) and the second surface 42 (e.g., the bottom surface). The second surface 42 of the third redistribution structure 4 may contact the first surface 21 of the second molded structure 2 directly.

The third redistribution structure 4 may include a plurality of dielectric layers 44, a plurality of circuit layers 45, a plurality of inner vias 46 and a plurality of pads 47. The dielectric layers 44 may be made of a cured photoimageable dielectric (PID) material such as epoxy or polyimide (PI) including photoinitiators. The material of the dielectric layers 44 may be the same with each other. In some embodiments, the material of the topmost dielectric layer 441 may be different from the material of the other dielectric layers 44. The topmost dielectric layer 441 may be a hybrid bonding (HB) dielectric layer, and may include $SiO_2$, SiCN and/or SiON. In some embodiments, the bottommost dielectric layer 442 may be omitted. The circuit layers 45 may be disposed on the first surface 21 of the second molded structure 2 directly.

The circuit layers 45 may be covered by or embedded in the dielectric layers 44. The circuit layers 45 may be fan-out circuit layers. The inner vias 46 may be embedded in the dielectric layers 44, and may connect adjacent two of the circuit layers 45. The inner vias 46 may taper toward the second molded structure 2. The pads 47 may be electrically connected to the circuit layers 45, and embedded in the dielectric layers 44 (e.g., the topmost dielectric layer 441). The pads 47 may be exposed from the first surface 41 of the third redistribution structure 4. Each of the pads 47 may be a hybrid bonding (HB) pad, and may include Cu or Al.

The second redistribution structure 8 may be disposed over and electrically connected to the first surface 41 of the third redistribution structure 4. Thus, the first redistribution structure 7 may be disposed between the first molded structure 5 and the upper electronic device 18. The second redistribution structure 8 may be disposed under the first molded structure 5. The third redistribution structure 4 may be disposed between the second redistribution structure 8 and the second molded structure 2.

The second redistribution structure 8 may be attached to and electrically connected to the first surface 41 of the third redistribution structure 4 by hybrid bonding. That is, the second surface 82 of the second redistribution structure 8 may contact the first surface 41 of the third redistribution structure 4 directly. Thus, the bottommost dielectric layer 841 of the second redistribution structure 8 may be attached to, may connect to and may contact the topmost dielectric layer 441 of the third redistribution structure 4 directly. The pads 87 of the second redistribution structure 8 may be attached to, may connect to and may contact the pads 47 of the third redistribution structure 4 directly. Therefore, the first molded structure 5 may be electrically connected to the second molded structure 2 by hybrid bonding.

The bumps 14 may be disposed on the second surface 22 of the second molded structure 2. For example, the bumps 14 may include a plurality of first bumps 141 and a plurality of second bumps 142. The first bumps 141 may be disposed on the second surface 3152 (e.g., the bottom surface) of the through via 315. Thus, the first bumps 141 may physically connect and electrically connect the through via 315 and the first surface 121 of the substrate 12. The second bumps 142 may be disposed on the second surface of the semiconductor device 20 (e.g., the second surface 252 of the first semiconductor device 25). Thus, second bumps 142 may connect the second surface of the semiconductor device 20 (e.g., the second surface 252 of the first semiconductor device 25) and the first surface 121 of the substrate 12. The second bumps 142 may have no electrical function, and may be dummy pads.

In some embodiments, the first bumps 141 and the second bumps 142 may be formed concurrently at a manufacturing stage. In some embodiments, the first bumps 141 and/or the second bumps 142 may include a reflowable material configured to control a gap between the second molded structure 2 and the substrate 12 so as to prevent the second molded structure 2 from tilting with respect to the substrate 12. In addition, a first gap g3 between adjacent two of the first bumps 141 may be less than a second gap g4 between adjacent two of the second bumps 142.

Figure 6:
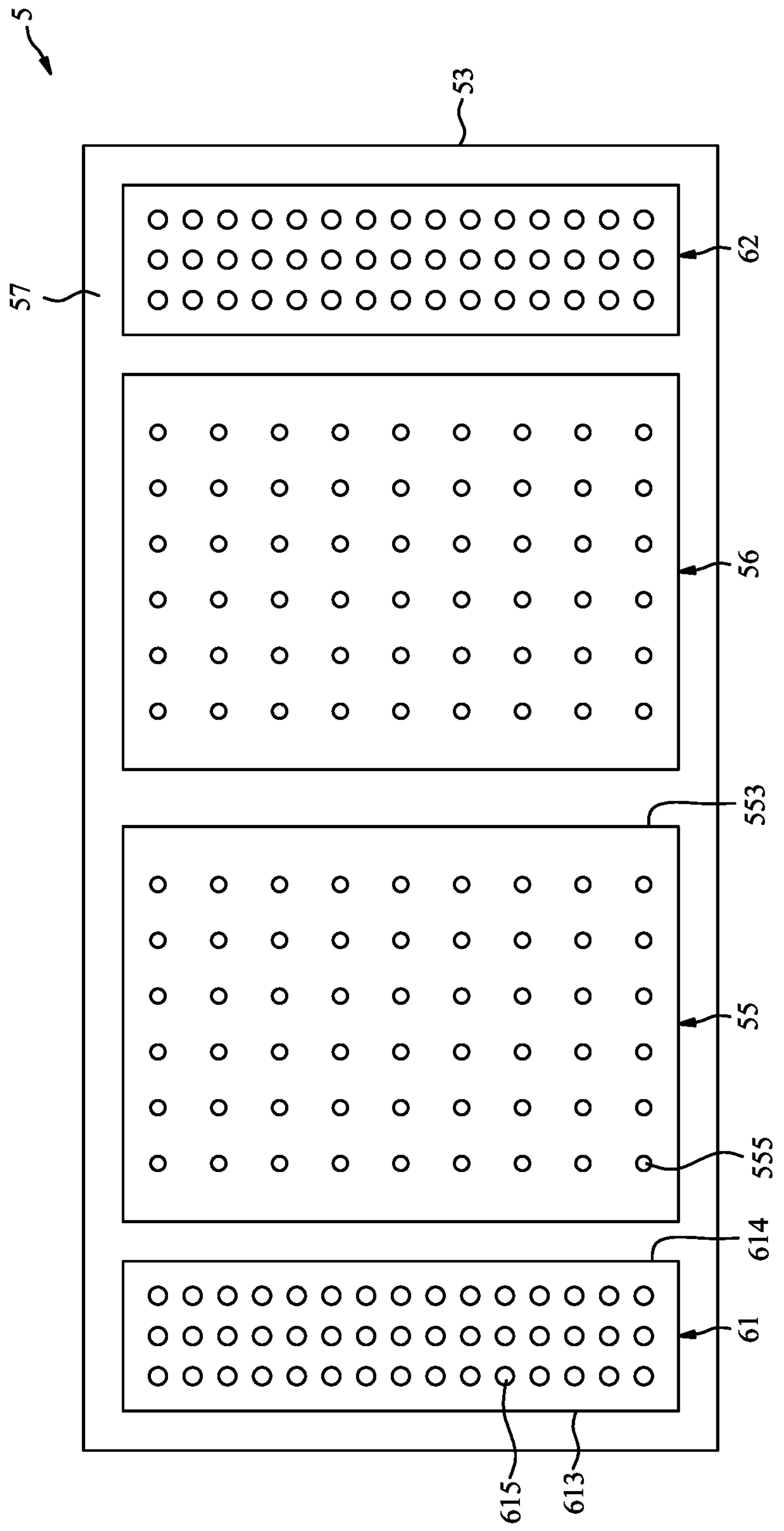
FIG. 6 is a top view of the first molded structure of the assembly structure of FIG. 1.

FIG. 6 is a top view of the first molded structure 5 of the assembly structure 1 of FIG. 1. The first inactive element 61 may include a plurality of rows of through vias 615, for example, three rows of through vias 615. The pads 555 of the first semiconductor device 55 may be arranged in an array. The size and the structure of the second semiconductor device 56 may be same as the size and the structure of the first semiconductor device 55. The size and the structure of the second inactive element 62 may be same as the size and the structure of the first inactive element 61. The second inactive element 62 and the first inactive element 61 may be disposed on opposite sides of the second semiconductor device 56 and the first semiconductor device 55.

Figure 7:
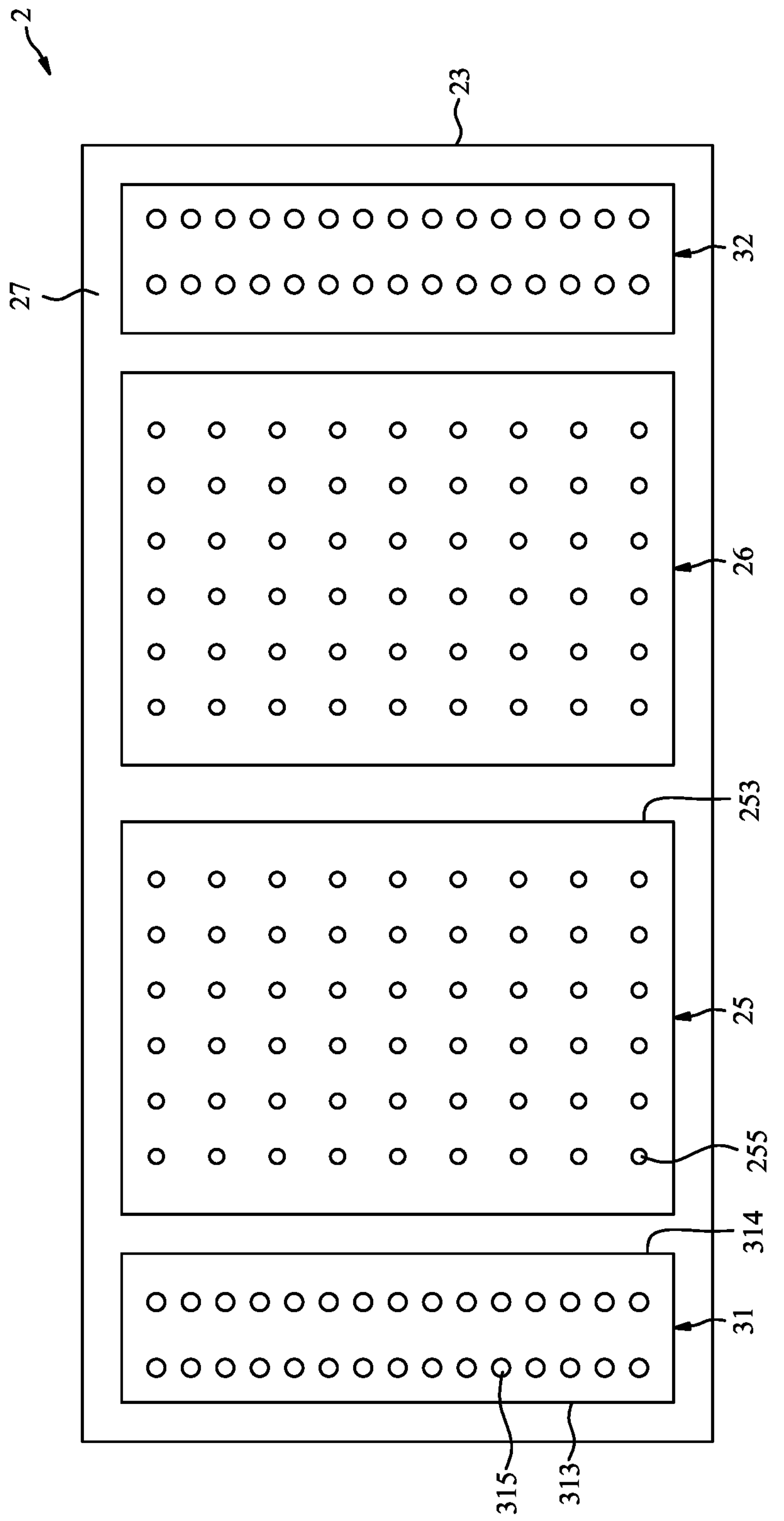
FIG. 7 is a top view of the second molded structure of the assembly structure of FIG. 1.

FIG. 7 is a top view of the second molded structure 2 of the assembly structure 1 of FIG. 1. The first inactive element 31 may include a plurality of rows of through vias 315, for example, two rows of through vias 315. The pads 255 of the first semiconductor device 25 may be arranged in an array. The size and the structure of the second semiconductor device 26 may be same as the size and the structure of the first semiconductor device 25. The size and the structure of the second inactive element 32 may be same as the size and the structure of the first inactive element 31. The second inactive element 32 and the first inactive element 31 may be disposed on opposite sides of the second semiconductor device 26 and the first semiconductor device 25.

In the embodiment illustrated in FIG. 1 to FIG. 7, the inactive element 6 (including, e.g., the first inactive element 61 and the second inactive element 62) of the first molded structure 5 is configured to provide a vertical conduction path between the upper electronic device 18 (or the first redistribution structure 7) and the second redistribution structure 8. The inactive element 3 (including, e.g., the first inactive element 31 and the second inactive element 32) of the second molded structure 2 is configured to provide a vertical conduction path between the third redistribution structure 4 and the substrate 12. Thus, the inactive element 6 (including, e.g., the first inactive element 61 and the second inactive element 62) of the first molded structure 5 and the inactive element 3 (including, e.g., the first inactive element 31 and the second inactive element 32) of the second molded structure 2 are configured to provide a vertical conduction path between the upper electronic device 18 and the substrate 12.

The upper electronic device 18 is not electrically connected to the substrate 12 through the semiconductor device 50 (e.g., the first semiconductor device 55 and the second semiconductor device 56) and the semiconductor device 20 (e.g., the first semiconductor device 25 and the second semiconductor device 26). It is not necessary to form a through via in the main portion (e.g., the main portion 550) of the semiconductor device 50 (e.g., the first semiconductor device 55 and the second semiconductor device 56). It is not necessary to form a through via in the main portion (e.g., the main portion 250) of the semiconductor device 20 (e.g., the first semiconductor device 25 and the second semiconductor device 26). The vertical conduction path may be disposed outside the semiconductor device 20 (e.g., the first semiconductor device 25 and the second semiconductor device 26) and the semiconductor device 50 (e.g., the first semiconductor device 55 and the second semiconductor device 56). Thus, the design flexibility is increased, and the manufacturing cost is reduced.

In addition, the active surface of the semiconductor device 50 (e.g., the first surface 551 (or the active surface) of the first semiconductor device 55) faces the active surface of the upper electronic device 18 (e.g., the first surface 181 of the upper electronic device 18), thus, the upper electronic device 18 can read from and/or write to the semiconductor device 50 (e.g., the first semiconductor device 55) quickly. Thus, the performance the package structure 10 can be improved.

Figure 8:
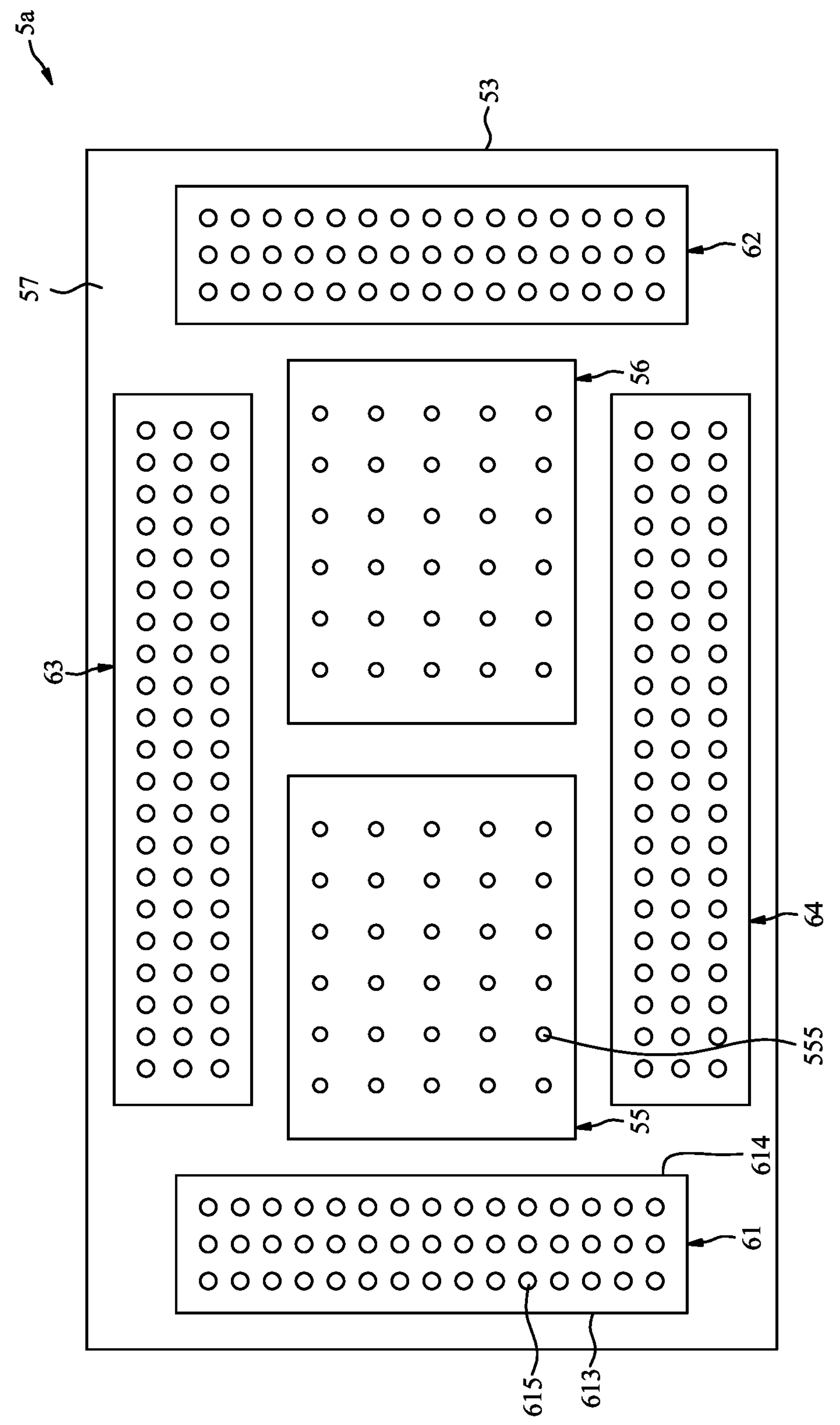
FIG. 8 is a top view of a first molded structure in accordance with some embodiments of the present disclosure.

FIG. 8 is a top view of a first molded structure 5*a* in accordance with some embodiments of the present disclosure. The first molded structure 5*a* may be similar to the first molded structure 5 of FIG. 6, and the differences are described as follows. The first molded structure 5*a* may further include a third first inactive element 63 and a fourth inactive element 64. The third first inactive element 63 and the fourth inactive element 64 may be disposed on opposite sides of the second semiconductor device 56 and the first semiconductor device 55. The size and the structure of the third first inactive element 63 and the fourth inactive element 64 may be same as or similar to the size and the structure of the first inactive element 61 and the second inactive element 62. The first inactive element 61, the second inactive element 62, the third first inactive element 63 and the fourth inactive element 64 may surround the second semiconductor device 56 and the first semiconductor device 55.

Figure 9:
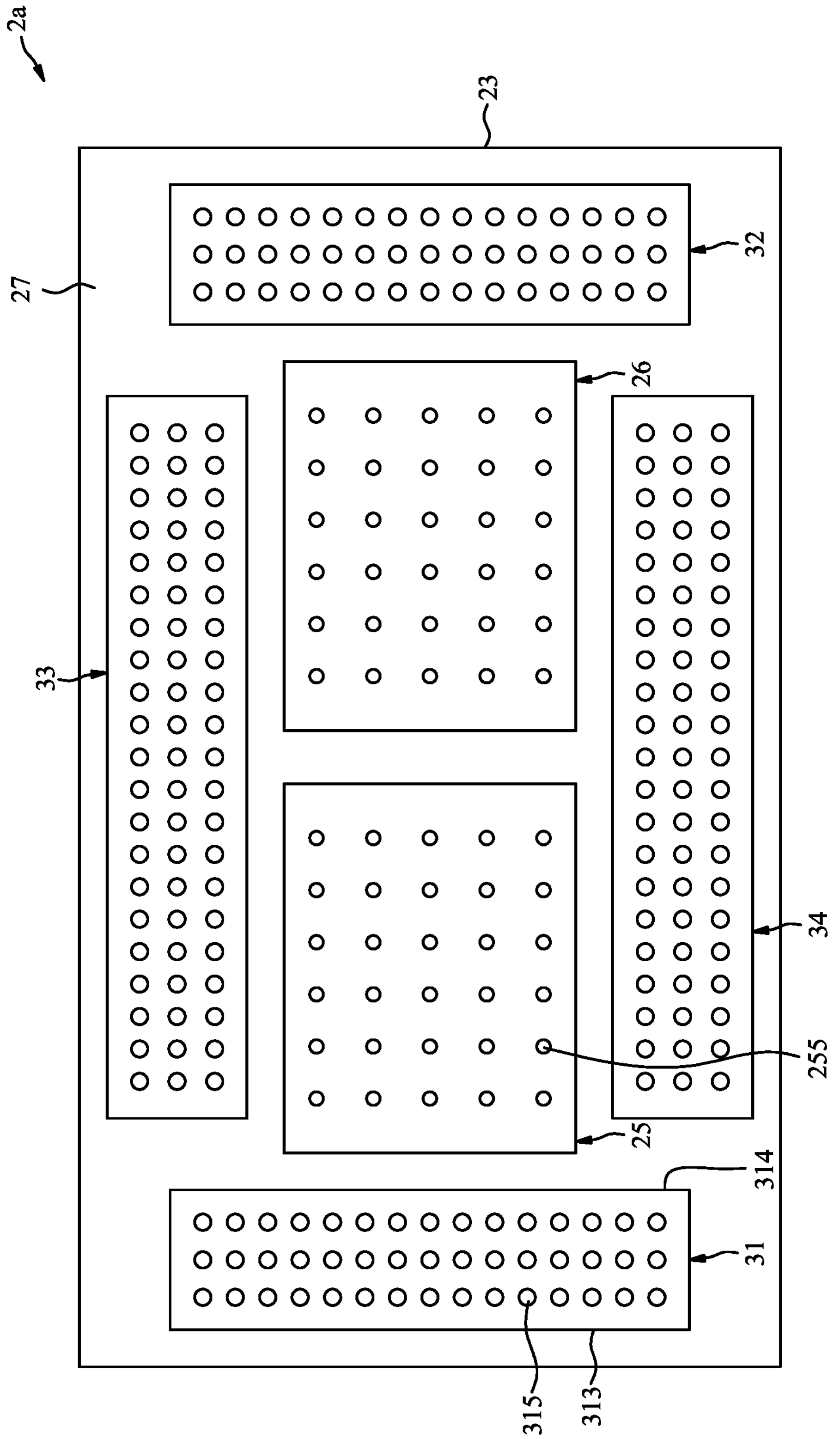
FIG. 9 is a top view of a second molded structure in accordance with some embodiments of the present disclosure.

FIG. 9 is a top view of a second molded structure 2*a* in accordance with some embodiments of the present disclosure. The second molded structure 2*a* may be similar to the second molded structure 2 of FIG. 7, and the differences are described as follows. The first inactive element 31 and the second inactive element 32 may include three rows of through vias 315. The second molded structure 2*a* may further include a third first inactive element 33 and a fourth inactive element 34. The third first inactive element 33 and the fourth inactive element 34 may be disposed on opposite sides of the second semiconductor device 26 and the first semiconductor device 25. The size and the structure of the third first inactive element 33 and the fourth inactive element 34 may be same as or similar to the size and the structure of the first inactive element 31 and the second inactive element 32. The first inactive element 31, the second inactive element 32, the third first inactive element 33 and the fourth inactive element 34 may surround the second semiconductor device 26 and the first semiconductor device 25.

Figure 10:
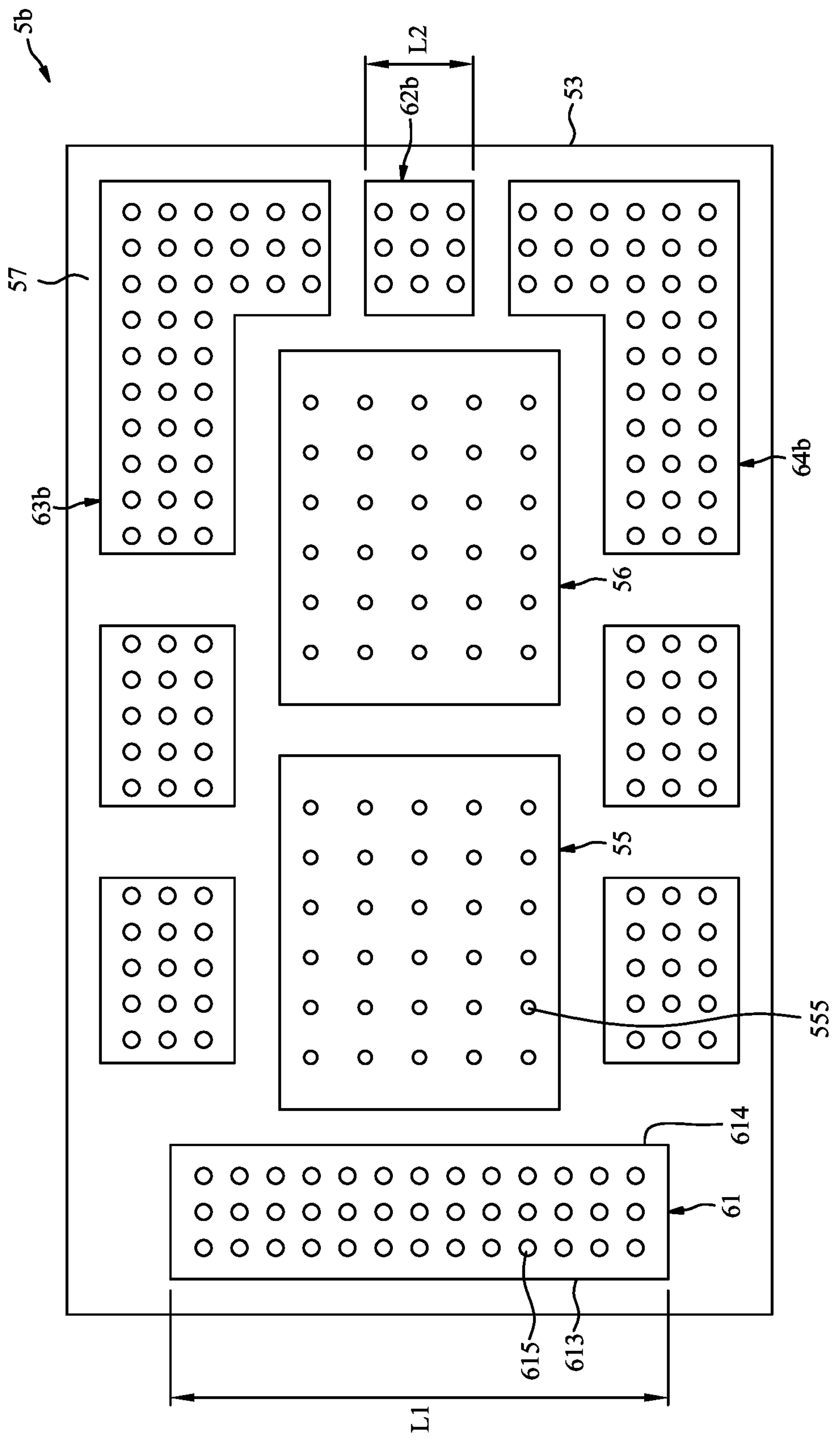
FIG. 10 is a top view of a first molded structure in accordance with some embodiments of the present disclosure.

FIG. 10 is a top view of a first molded structure 5*b* in accordance with some embodiments of the present disclosure. The first molded structure 5*b* may be similar to the first molded structure 5*a* of FIG. 8, and the differences are described as follows. A size of the first inactive element 61 may be different from and a size of the second inactive element 62*b* from the top view. For example, a length L1 of the first inactive element 61 may be greater than a length L2 of the second inactive element 62*b*. In addition, each of the third first inactive element 63*b* and the fourth inactive element 64*b* may be in an L shape, and may be disposed adjacent to or disposed around a corner of the second semiconductor device 56.

Figure 11:
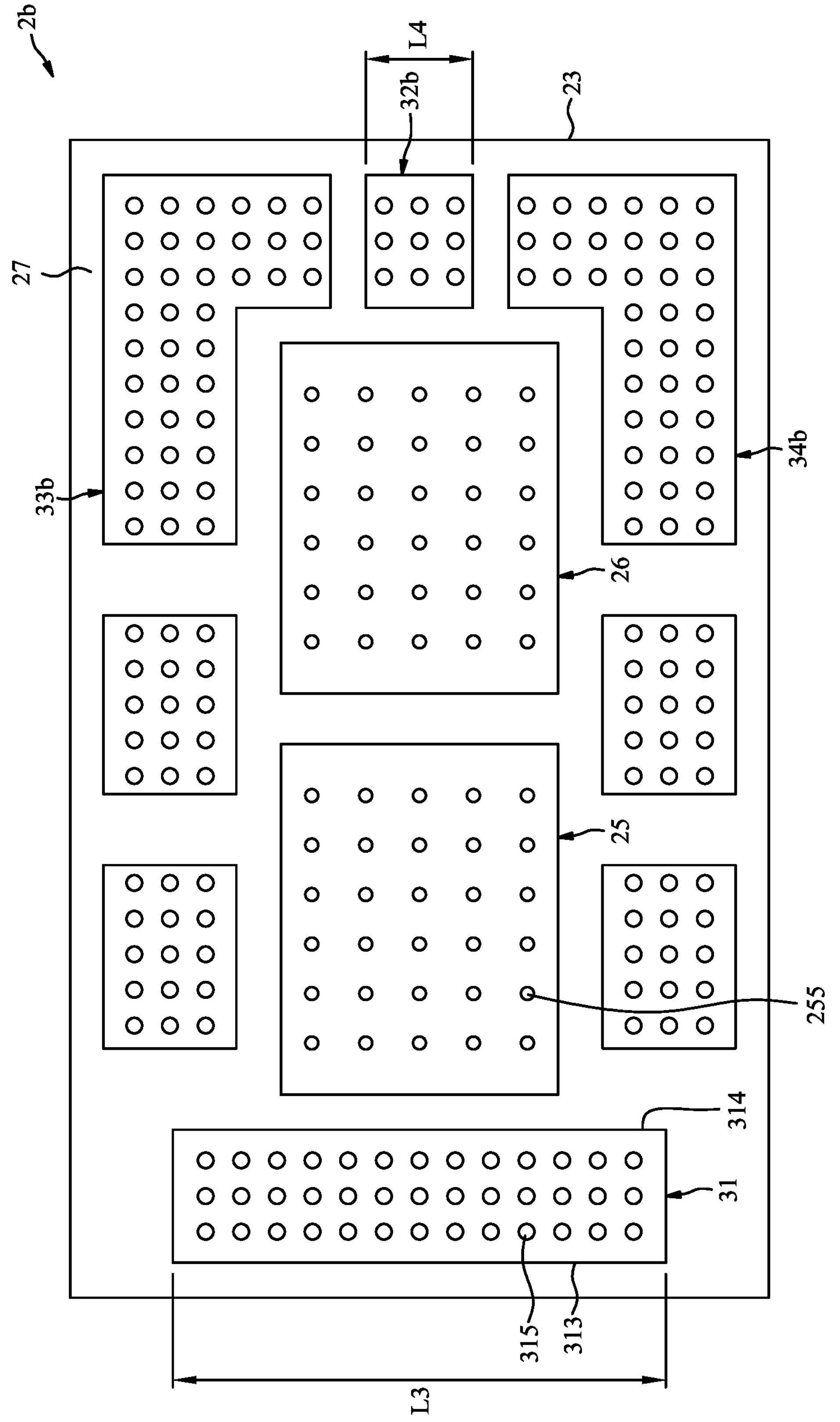
FIG. 11 is a top view of a second molded structure in accordance with some embodiments of the present disclosure.

FIG. 11 is a top view of a second molded structure 2*b* in accordance with some embodiments of the present disclosure. The second molded structure 2*b* may be similar to the second molded structure 2*a* of FIG. 9, and the differences are described as follows. A size of the first inactive element 31 may be different from and a size of the second inactive element 32*b* from the top view. For example, a length L3 of the first inactive element 31 may be greater than a length L4 of the second inactive element 32*b*. In addition, each of the third first inactive element 33*b* and the fourth inactive element 34*b* may be in an L shape, and may be disposed adjacent to or disposed around a corner of the second semiconductor device 26.

Figure 12:
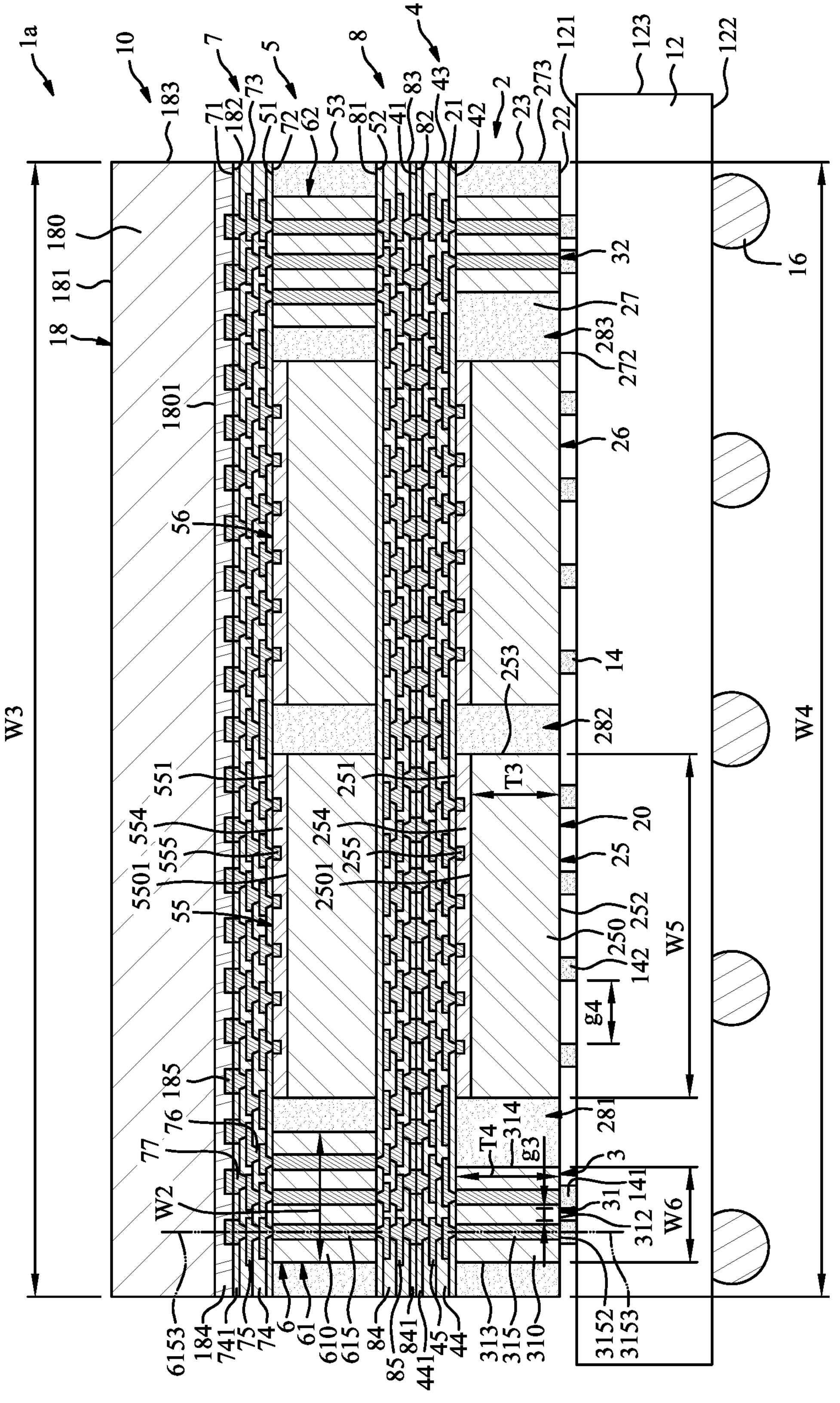
FIG. 12 is a schematic cross-sectional view of an assembly structure in accordance with some embodiments of the present disclosure.

FIG. 12 is a schematic cross-sectional view of an assembly structure 1*a* in accordance with some embodiments of the present disclosure. The assembly structure 1*a* may be similar to the assembly structure 1 of FIG. 1 except for the structure and the size of the inactive element 3 (including, e.g., the first inactive element 31 and the second inactive element 32) of the second molded structure 2. For example, the width W6 of the first inactive element 31 (or the main portion 310) of the second molded structure 2 may be less than the width W2 of the first inactive element 31 (or the main portion 310) of the first molded structure 5. All of the central axes 3153 of all of the through vias 315 of the second molded structure 2 may be aligned with the central axes 6153 of the corresponding through vias 615 of the first molded structure 5.

Figure 13:
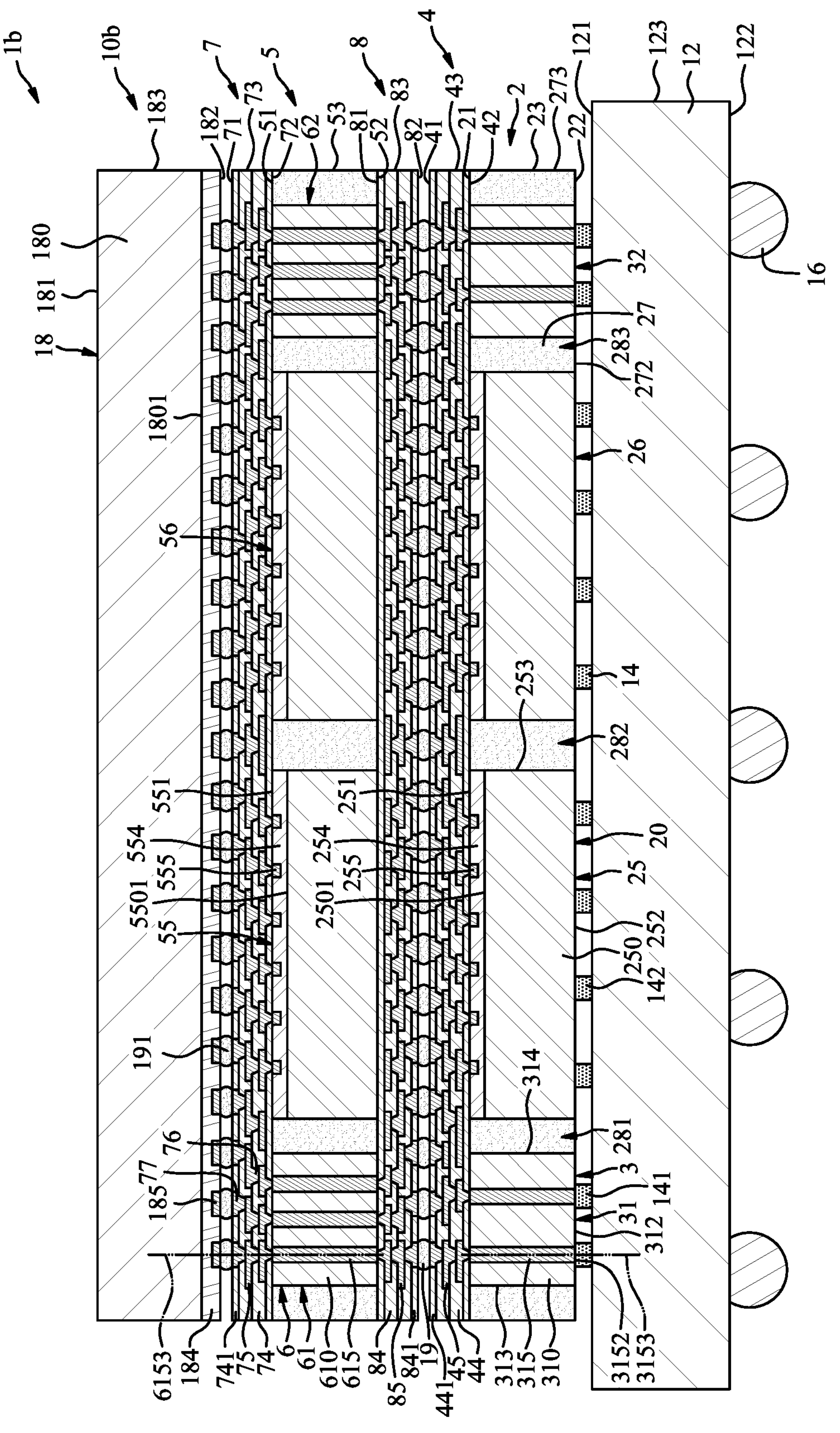
FIG. 13 is a schematic cross-sectional view of an assembly structure in accordance with some embodiments of the present disclosure.

FIG. 13 is a schematic cross-sectional view of an assembly structure 1*b* in accordance with some embodiments of the present disclosure. The assembly structure 1*b* may be similar to the assembly structure 1 of FIG. 1 except for the structure of the package structure 10*b*. In the package structure 10*b*, the second surface 182 of the upper electronic device 18 does not contact the first surface 71 of the first redistribution structure 7. The second surface 182 of the upper electronic device 18 is spaced apart from the first surface 71 of the first redistribution structure 7. The pads 185 of the upper electronic device 18 may be electrically connected to the pads 77 of the first redistribution structure 7 through a plurality of solder materials 191. The solder materials 191 may include a reflowable material such as AgSn. Thus, the upper electronic device 18 is electrically connected to the first redistribution structure 7 through solder bonding instead of hybrid bonding. The pads 185 of the upper electronic device 18 and the pads 77 of the first redistribution structure 7 may be solder bonding pads.

In addition, the second surface 82 of the second redistribution structure 8 does not contact the first surface 41 of the third redistribution structure 4. The second surface 82 of the second redistribution structure 8 is spaced apart from the first surface 41 of the third redistribution structure 4. The pads 87 of the second redistribution structure 8 may be electrically connected to the pads 47 of the third redistribution structure 4 through a plurality of solder materials 19. The solder materials 19 may include a reflowable material such as AgSn. Thus, the second redistribution structure 8 is electrically connected to the third redistribution structure 4 through solder bonding instead of hybrid bonding. The pads 87 of the second redistribution structure 8 and the pads 47 of the third redistribution structure 4 may be solder bonding pads. Therefore, the first molded structure 5 may be electrically connected to the second molded structure 2 through the solder materials 19.

FIG. 14 to FIG. 25 illustrate various stages of a method of manufacturing an assembly structure 1, in accordance with some embodiments of the present disclosure.

Figure 14:
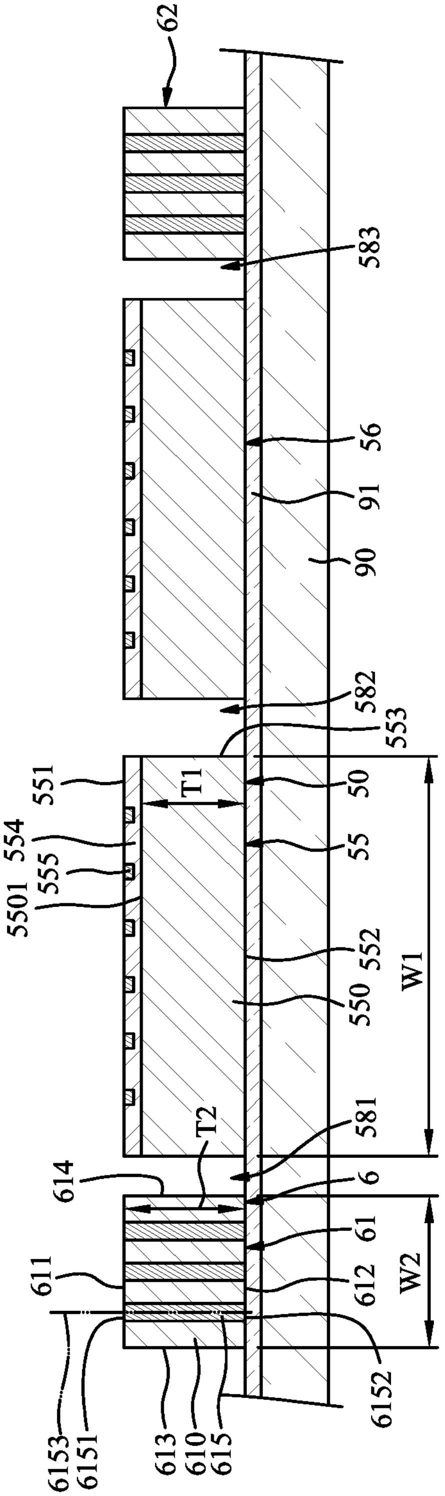
FIG. 14 to FIG. 25 illustrate various stages of a method of manufacturing an assembly structure, in accordance with some embodiments of the present disclosure.
Figure 15:
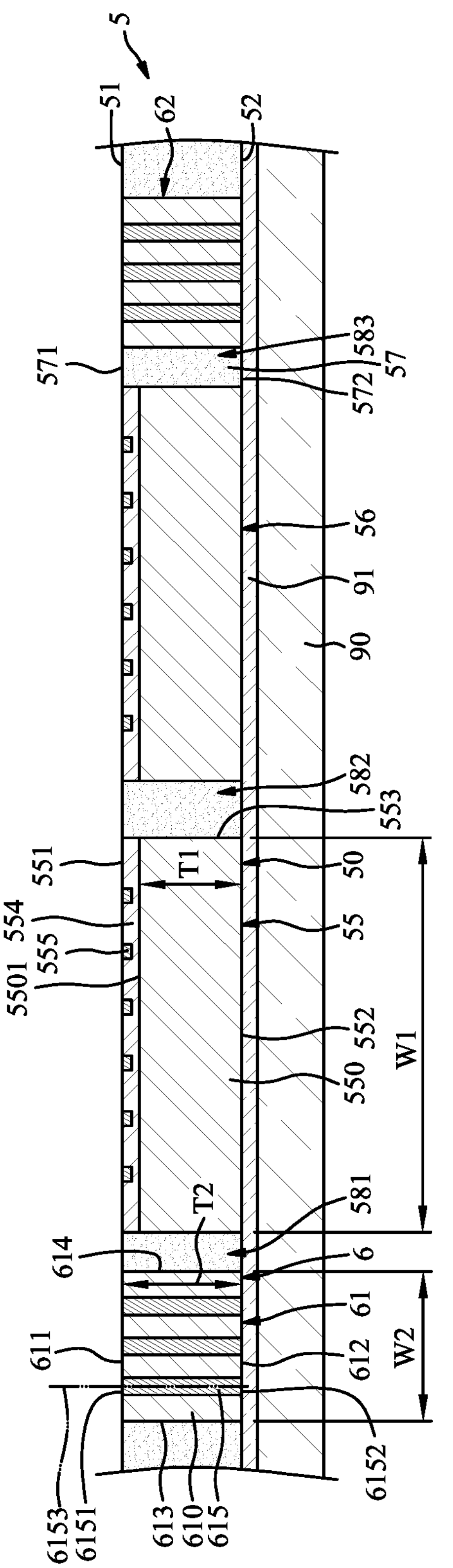

Referring to FIG. 14 and FIG. 15, a first molded structure 5 may be formed on a first carrier 90. Referring to FIG. 14, at least one semiconductor device 50 and at least one inactive element 6 may be disposed side by side on the first carrier 90. In some embodiments, the first carrier 90 may include a release layer 91 on a surface thereof. The semiconductor device 50 and the inactive element 6 may be disposed on the release layer 91. In some embodiments, the singulated semiconductor device 50 (e.g., the first semiconductor device 55 and the second semiconductor device 56) and the singulated inactive element 6 (e.g., the first inactive element 61 and the second inactive element 62) may be reconstructed or rearranged on the release layer 91 of the first carrier 90. In some embodiments, only known good dice, e.g., the known good semiconductor device 50 (e.g., the first semiconductor device 55 and the second semiconductor device 56) and the known good inactive element 6 (e.g., the first inactive element 61 and the second inactive element 62) are used.

In some embodiments, the size and the function of the first semiconductor device 55 may be same as the size and the function of the second semiconductor device 56. Both of the first semiconductor device 55 and the second semiconductor device 56 may be memory dice.

The first semiconductor device 55 may have a first surface 551 (e.g., a top surface or an active surface), a second surface 552 (e.g., a bottom surface or a backside surface) and a lateral surface 553. The second surface 552 (e.g., the bottom surface) may be opposite to the first surface 551 (e.g., the top surface). The lateral surface 553 may extend between the first surface 551 (e.g., the top surface) and the second surface 552 (e.g., the bottom surface).

The first semiconductor device 55 may include a main portion 550 and an active circuit structure 554 disposed on a top surface 5501 of the main portion 550. The active circuit structure 554 may include a plurality of dielectric layers, a plurality of circuit layers and a plurality of pads 555. The dielectric layers may cover the circuit layers. The pads 555 may be electrically connected to the circuit layers, and embedded in the dielectric layers. The pads 555 may be exposed from the first surface 551 of the first semiconductor device 55. The active circuit structure 554 and the pads 555 may face up. The second surface 552 (e.g., the bottom surface) of the first semiconductor device 55 may contact the release layer 91 of the first carrier 90.

The inactive element 6 may include a first inactive element 61 and a second inactive element 62 disposed around the first semiconductor device 55 and the second semiconductor device 56. A structure of the first inactive element 61 may be same as or similar to a structure of the second inactive element 62.

The first inactive element 61 may have a first surface 611 (e.g., a top surface), a second surface 612 (e.g., a bottom surface) and two lateral surfaces 613, 614. The second surface 612 (e.g., the bottom surface) may be opposite to the first surface 611 (e.g., the top surface). The lateral surfaces 613, 614 may extend between the first surface 611 (e.g., the top surface) and the second surface 612 (e.g., the bottom surface).

A space 581 may be formed between the first semiconductor device 55 and the first inactive element 61. A space 582 may be formed between the first semiconductor device 55 and the second semiconductor device 56. A space 583 may be formed between the second semiconductor device 56 and the second inactive element 62.

The first inactive element 61 may include a main portion 610 and at least one through via 615 (or through silicon via (TSV)) extending through the main portion 610. The main portion 610 may have a first surface 611 (e.g., a top surface), a second surface 612 (e.g., a bottom surface) and two lateral surfaces 613, 614. The second surface 612 (e.g., the bottom surface) may be opposite to the first surface 611 (e.g., the top surface). The lateral surfaces 613, 614 may extend between the first surface 611 (e.g., the top surface) and the second surface 612 (e.g., the bottom surface). Thus, the first surface 611, the second surface 612 and the lateral surfaces 613, 614 of the first inactive element 61 may be the first surface 611, the second surface 612 and the lateral surfaces 613, 614 of the main portion 610, respectively.

The semiconductor device 50 (including, e.g., the first semiconductor device 55 and the second semiconductor device 56) does not include a vertical conduction path in the main portion thereof. For example, the first semiconductor device 55 does not include a vertical conduction path in the main portion 550 thereof.

The through via 615 of the first inactive element 61 may have a first surface 6151 (e.g., a top surface) and a second surface 6152 (e.g., a bottom surface) opposite to the first surface 6151 (e.g., the top surface). The first surface 6151 of the first through via 615 of the first inactive element 61 may be substantially coplanar with and exposed from the first surface 611 of the first inactive element 61. The second surface 6152 of the through via 615 of the first inactive element 61 may be substantially coplanar with and exposed from the second surface 612 of the first inactive element 61.

In some embodiments, the inactive element 6 does not include a horizontal conduction path (e.g., a horizontal circuit layer) on the main portion thereof. For example, the first inactive element 61 does not include a horizontal conduction path (e.g., a horizontal circuit layer) on the main portion 610 thereof. There is no horizontal conduction path on the first surface 611 of the main portion 610 nor on the second surface 612 of the main portion 610. The inactive element 6 only include the vertical conduction path. The second surface 612 of the inactive element 6 may contact the release layer 91 of the first carrier 90.

Referring to FIG. 15, an encapsulant 57 may be formed on the release layer 91 of the first carrier 90 to encapsulate the semiconductor device 50 (including, e.g., the first semiconductor device 55 and the second semiconductor device 56) and the inactive element 6 (e.g., the first inactive element 61 and the second inactive element 62). The encapsulant 57 may be disposed in the space 581, the space 582 and the space 583.

Then, a grinding process may be conducted to form the first molded structure 5 on the first carrier 90. The first molded structure 5 may include the semiconductor device 50, the inactive element 6 and the encapsulant 57. The first molded structure 5 may have a first surface 51 (e.g., a top surface) and a second surface 52 (e.g., a bottom surface) opposite to the first surface 51 (e.g., the top surface).

The encapsulant 57 may have a first surface 571 (e.g., a top surface) and a second surface 572 (e.g., a bottom surface) opposite to the first surface 571 (e.g., the top surface). The first surface 571 of the encapsulant 57 may be substantially coplanar with or aligned with the first surface 611 of the first inactive element 61 and the first surface 551 of the first semiconductor device 55. Thus, the first surface 51 of the first molded structure 5 may include the first surface 571 of the encapsulant 57, the first surface 611 of the first inactive element 61 and the first surface 551 of the first semiconductor device 55. In addition, the second surface 572 of the encapsulant 57 may be substantially coplanar with or aligned with the second surface 612 of the first inactive element 61 and the second surface 552 of the first semiconductor device 55. Thus, the second surface 52 of the first molded structure 5 may include the second surface 572 of the encapsulant 57, the second surface 612 of the first inactive element 61 and the second surface 552 of the first semiconductor device 55.

Figure 16:
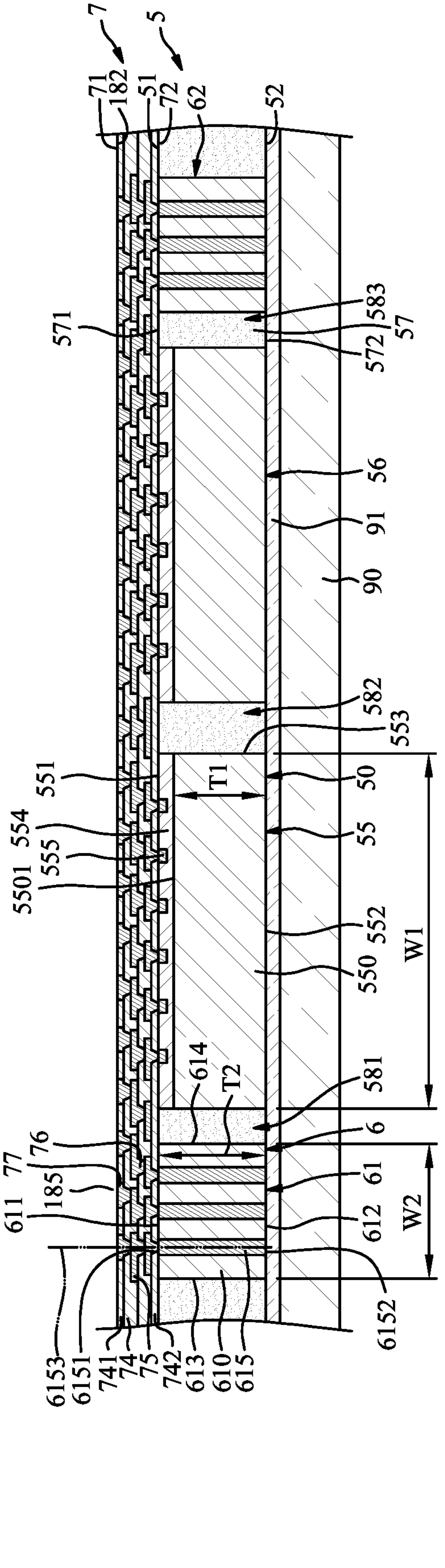

Referring to FIG. 16, a first redistribution structure 7 may be formed or disposed on the first surface 51 of the first molded structure 5. For example, the first redistribution structure 7 may be formed or disposed on the first surface 571 of the encapsulant 57, the first surface 611 of the first inactive element 61 and the first surface 551 of the first semiconductor device 55. The first redistribution structure 7 may be electrically connected to the semiconductor device 50 (e.g., the first semiconductor device 55 and the second semiconductor device 56) and through via 615 of the inactive element 6 (e.g., the first inactive element 61 and the second inactive element 62).

The first redistribution structure 7 may be a fan-out structure. The first redistribution structure 7 may have a first surface 71 (e.g., a top surface) and a second surface 72 (e.g., a bottom surface) opposite to the first surface 71 (e.g., the top surface). The second surface 72 of the first redistribution structure 7 may contact the first surface 51 of the first molded structure 5 directly.

The first redistribution structure 7 may include a plurality of dielectric layers 74, a plurality of circuit layers 75, a plurality of inner vias 76 and a plurality of pads 77. The material of the dielectric layers 74 may be the same with each other. In some embodiments, the material of the topmost dielectric layer 741 may be different from the material of the other dielectric layers 74. The topmost dielectric layer 741 may be a hybrid bonding (HB) dielectric layer. In some embodiments, the bottommost dielectric layer 742 may be omitted. The circuit layers 75 may be disposed on the first surface 51 of the first molded structure 5 directly.

The circuit layers 75 may be covered by or embedded in the dielectric layers 74. The circuit layers 75 may be fan-out circuit layers. The inner vias 76 may be embedded in the dielectric layers 74, and may connect adjacent two of the circuit layers 75. The inner vias 76 may taper toward the first molded structure 5. The pads 77 may be electrically connected to the circuit layers 75, and embedded in the dielectric layers 74 (e.g., the topmost dielectric layer 741). The pads 77 may be exposed from the first surface 71 of the first redistribution structure 7. Each of the pads 77 may be a hybrid bonding (HB) pad.

Figure 17:
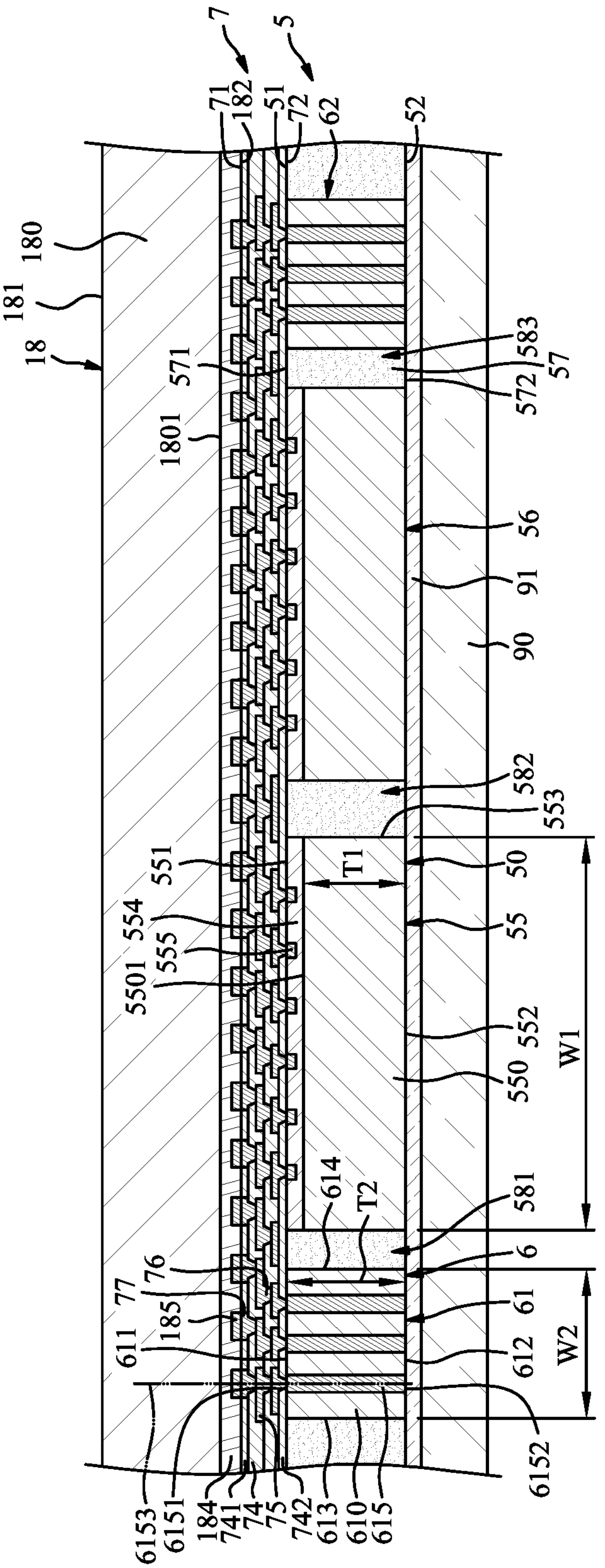

Referring to FIG. 17, an upper electronic device 18 may be disposed on and electrically connected to the first surface 71 of the first redistribution structure 7. The upper electronic device 18 may be in a wafer type, a panel type or a chip type. The upper electronic device 18 may have a first surface 181 (e.g., a top surface or a backside surface) and a second surface 182 (e.g., a bottom surface or an active surface) opposite to the first surface 181 (e.g., the top surface).

The upper electronic device 18 may include a main portion 180 and an active circuit structure 184 disposed on a bottom surface 1801 of the main portion 180. The active circuit structure 184 may include a plurality of dielectric layers, a plurality of circuit layers and a plurality of pads 185. The dielectric layers may cover the circuit layers. The pads 185 may be electrically connected to the circuit layers, and embedded in the dielectric layers. The pads 185 may be exposed from the second surface 182 of the upper electronic device 18. The active circuit structure 184 may include a bottommost dielectric layer surrounding the pads 185. The bottommost dielectric layer may be a hybrid bonding (HB) dielectric layer. Each of the pads 185 may be a hybrid bonding (HB) pad.

The upper electronic device 18 may be attached to and electrically connected to the first surface 71 of the first redistribution structure 7 by hybrid bonding. That is, the second surface 182 of the upper electronic device 18 may contact the first surface 71 of the first redistribution structure 7 directly. Thus, the active circuit structure 184 of the upper electronic device 18 may be attached to, may connect to and may contact the topmost dielectric layer 741 of the first redistribution structure 7 directly. The pads 185 of the upper electronic device 18 may be attached to, may connect to and may contact the pads 77 of the first redistribution structure 7 directly.

Figure 18:
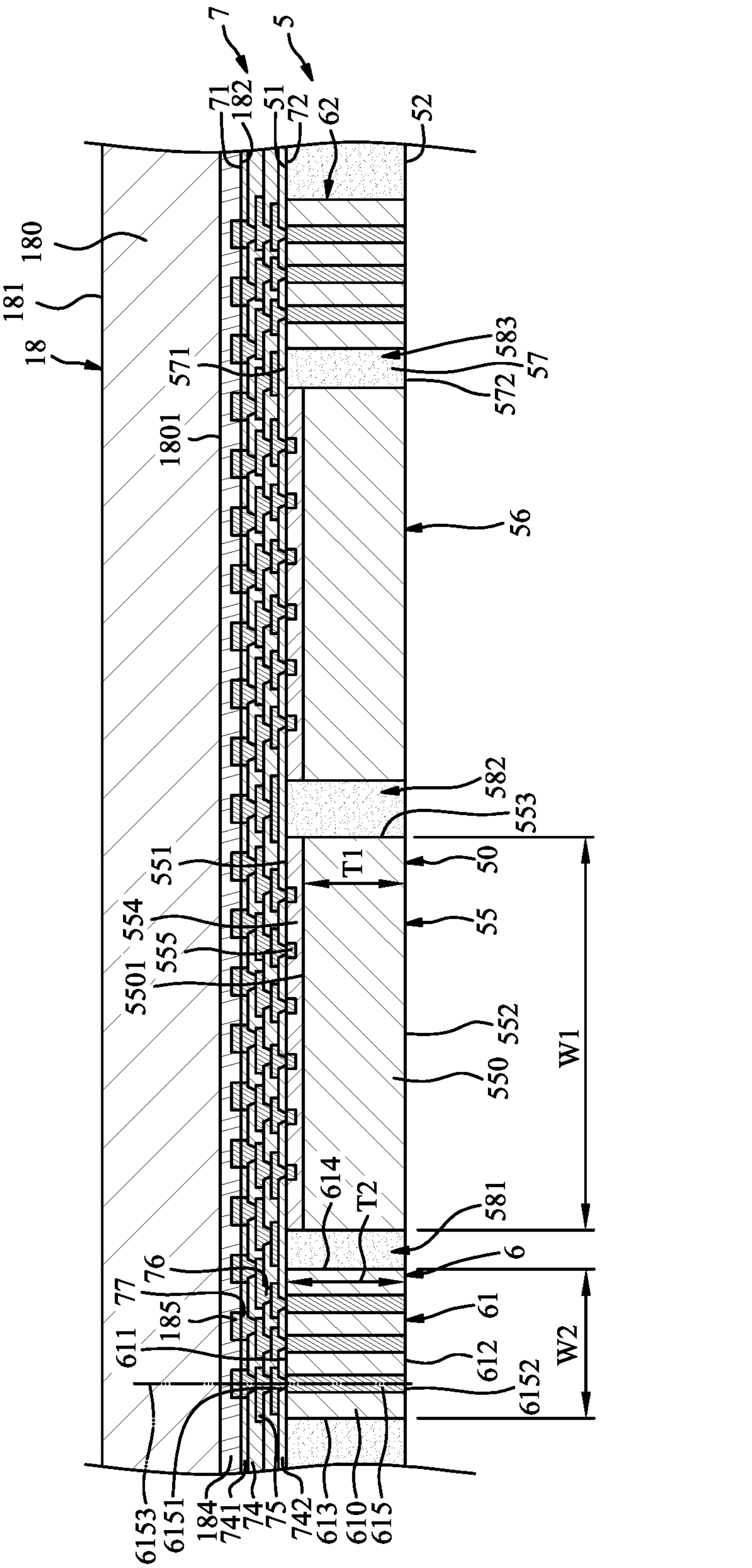

Referring to FIG. 18, the release layer 91 and the first carrier 90 may be removed from the first molded structure 5. Then, a grinding process may be conducted to the second surface 52 of the first molded structure 5.

Figure 19:
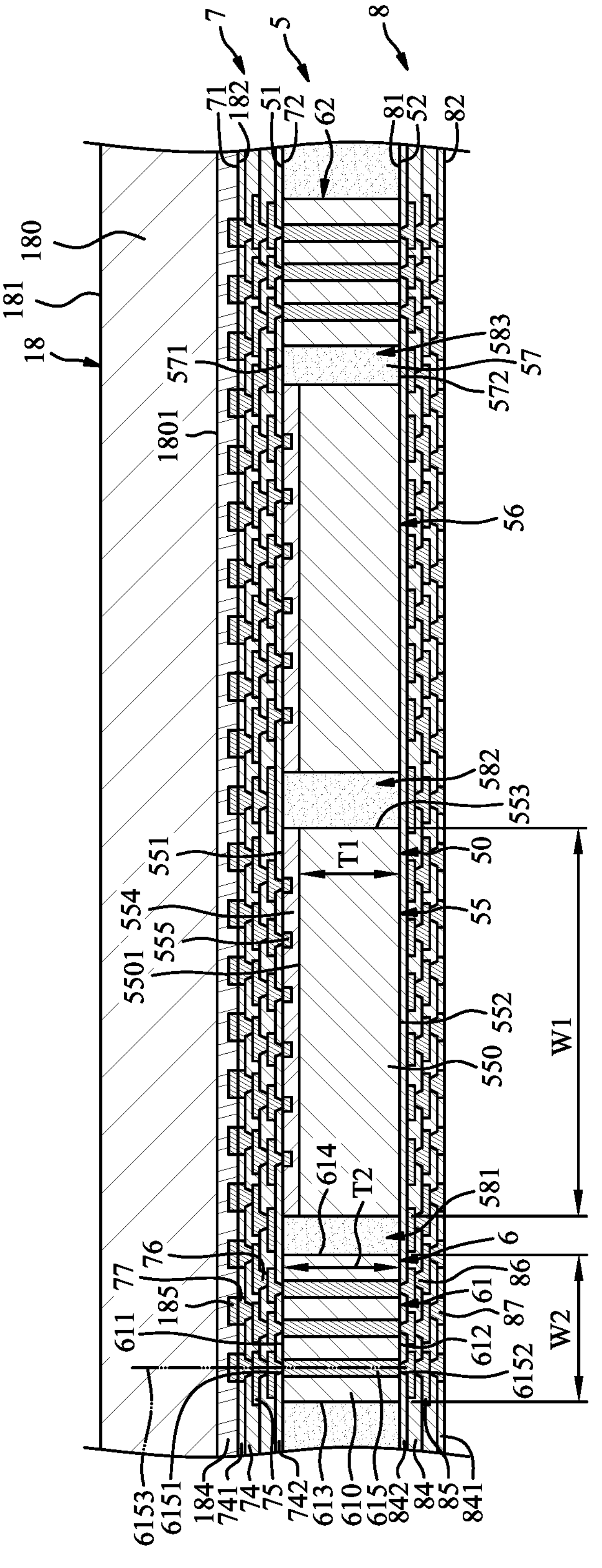

Referring to FIG. 19, a second redistribution structure 8 may be formed or disposed on the second surface 52 of the first molded structure 5. For example, the second redistribution structure 8 may be formed or disposed on the second surface 572 of the encapsulant 57, the second surface 612 of the first inactive element 61 and the second surface 552 of the first semiconductor device 55. The second redistribution structure 8 may be electrically connected to the through via 615 of the inactive element 6 (e.g., the first inactive element 61 and the second inactive element 62).

The second redistribution structure 8 may be a fan-out structure. The second redistribution structure 8 may have a first surface 81 (e.g., a top surface) and a second surface 82 (e.g., a bottom surface) opposite to the first surface 81 (e.g., the top surface). The second surface 82 of the second redistribution structure 8 may contact the second surface 52 of the first molded structure 5 directly.

The second redistribution structure 8 may include a plurality of dielectric layers 84, a plurality of circuit layers 85, a plurality of inner vias 86 and a plurality of pads 87. The material of the dielectric layers 84 may be the same with each other. In some embodiments, the material of the bottommost dielectric layer 841 may be different from the material of the other dielectric layers 84. The bottommost dielectric layer 841 may be a hybrid bonding (HB) dielectric layer. In some embodiments, the topmost dielectric layer 842 may be omitted. The circuit layers 85 may be disposed on the second surface 52 of the first molded structure 5 directly.

The circuit layers 85 may be covered by or embedded in the dielectric layers 84. The circuit layers 85 may be fan-out circuit layers. The inner vias 86 may be embedded in the dielectric layers 84, and may connect adjacent two of the circuit layers 85. The inner vias 86 may taper toward the first molded structure 5. The pads 87 may be electrically connected to the circuit layers 85, and embedded in the dielectric layers 84 (e.g., the bottommost dielectric layer 841). The pads 87 may be exposed from the second surface 82 of the second redistribution structure 8. Each of the pads 87 may be a hybrid bonding (HB) pad.

Figure 20:
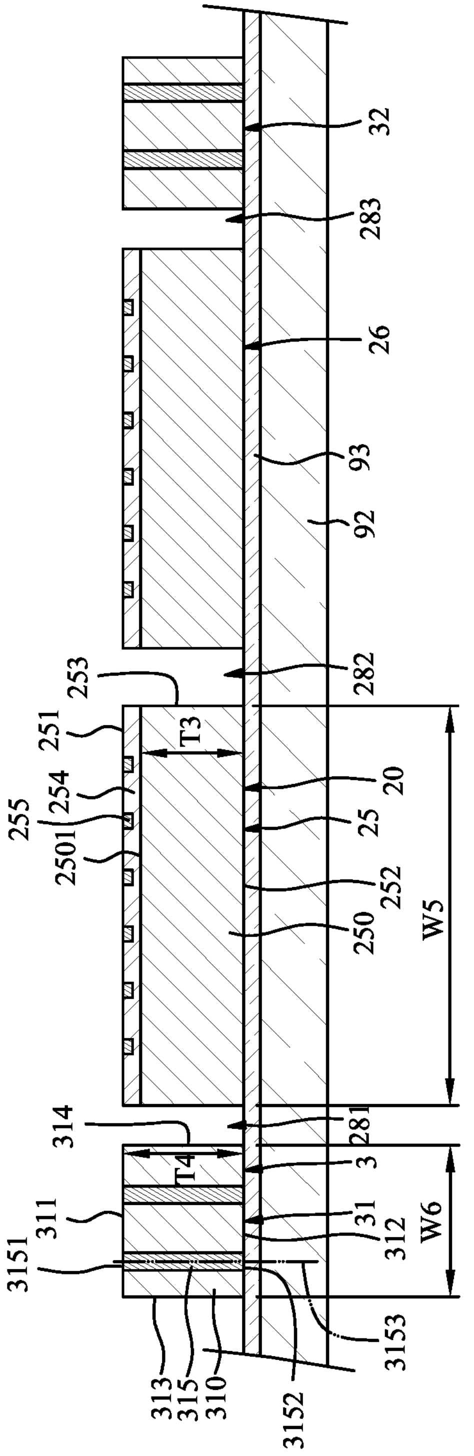
Figure 21:
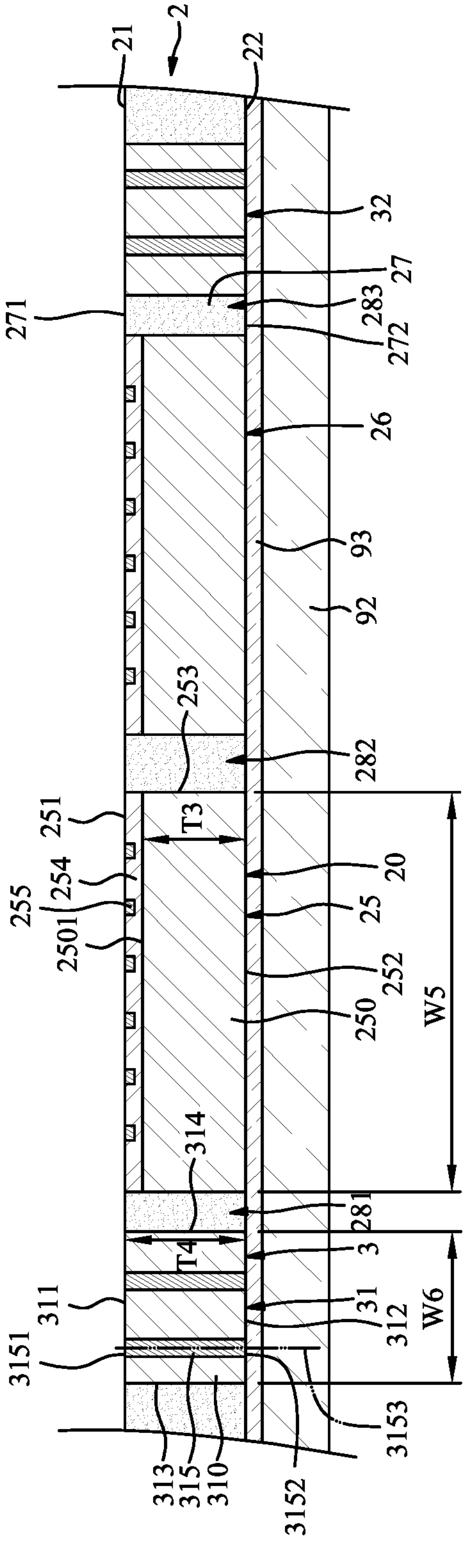

Referring to FIG. 20 and FIG. 21, a second molded structure 2 may be formed on a second carrier 92. Referring to FIG. 20, at least one semiconductor device 20 and at least one inactive element 3 may be disposed side by side on a second carrier 92. In some embodiments, the second carrier 92 may include a release layer 93 on a surface thereof.

The semiconductor device 20 and the inactive element 3 may be disposed on the release layer 93. In some embodiments, the singulated semiconductor device 20 (e.g., the first semiconductor device 25 and the second semiconductor device 26) and the singulated inactive element 3 (e.g., the first inactive element 31 and the second inactive element 32) may be reconstructed or rearranged on the release layer 93 of the second carrier 92. In some embodiments, only known good dice, e.g., the known good semiconductor device 20 (e.g., the first semiconductor device 25 and the second semiconductor device 26) and the known good inactive element 3 (e.g., the first inactive element 31 and the second inactive element 32) are used.

The first semiconductor device 25 may have a first surface 251 (e.g., a top surface or an active surface), a second surface 252 (e.g., a bottom surface or a backside surface) and a lateral surface 253. The second surface 252 (e.g., the bottom surface) may be opposite to the first surface 251 (e.g., the top surface). The lateral surface 253 may extend between the first surface 251 (e.g., the top surface) and the second surface 252 (e.g., the bottom surface).

The first semiconductor device 25 may include a main portion 250 and an active circuit structure 254 disposed on a top surface 2501 of the main portion 250. The active circuit structure 254 may include a plurality of dielectric layers, a plurality of circuit layers and a plurality of pads 255. The dielectric layers may cover the circuit layers. The pads 255 may be electrically connected to the circuit layers, and embedded in the dielectric layers. The pads 255 may be exposed from the first surface 251 of the first semiconductor device 25. The active circuit structure 254 and the pads 255 may face up. The second surface 252 (e.g., the bottom surface) of the first semiconductor device 25 may contact the release layer 93 of the second carrier 92.

The inactive element 3 may include a first inactive element 31 and a second inactive element 32 disposed around the first semiconductor device 25 and the second semiconductor device 26. A structure of the first inactive element 31 may be same as or similar to a structure of the second inactive element 32.

The first inactive element 31 may have a first surface 311 (e.g., a top surface), a second surface 312 (e.g., a bottom surface) and two lateral surfaces 313, 314. The second surface 312 (e.g., the bottom surface) may be opposite to the first surface 311 (e.g., the top surface). The lateral surfaces 313, 314 may extend between the first surface 311 (e.g., the top surface) and the second surface 312 (e.g., the bottom surface).

A space 281 may be formed between the first semiconductor device 25 and the first inactive element 31. A space 282 may be formed between the first semiconductor device 25 and the second semiconductor device 26. A space 283 may be formed between the second semiconductor device 26 and the second inactive element 32.

The first inactive element 31 may include a main portion 310 and at least one through via 315 (or through silicon via (TSV)) extending through the main portion 310. The main portion 310 may have a first surface 311 (e.g., a top surface), a second surface 312 (e.g., a bottom surface) and two lateral surfaces 313, 314. The second surface 312 (e.g., the bottom surface) may be opposite to the first surface 311 (e.g., the top surface). The lateral surfaces 313, 314 may extend between the first surface 311 (e.g., the top surface) and the second surface 312 (e.g., the bottom surface). Thus, the first surface 311, the second surface 312 and the lateral surfaces 313, 314 of the first inactive element 31 may be the first surface 311, the second surface 312 and the lateral surfaces 313, 314 of the main portion 310, respectively.

The through via 315 of the first inactive element 31 may have a first surface 3151 (e.g., a top surface) and a second surface 3152 (e.g., a bottom surface) opposite to the first surface 3151 (e.g., the top surface). The first surface 3151 of the first through via 315 of the first inactive element 31 may be substantially coplanar with and exposed from the first surface 311 of the first inactive element 31. The second surface 3152 of the through via 315 of the first inactive element 31 may be substantially coplanar with and exposed from the second surface 312 of the first inactive element 31.

In some embodiments, the inactive element 3 does not include a horizontal conduction path (e.g., a horizontal circuit layer) on the main portion thereof. For example, the first inactive element 31 does not include a horizontal conduction path (e.g., a horizontal circuit layer) on the main portion 310 thereof. There is no horizontal conduction path on the first surface 311 of the main portion 310 nor on the second surface 312 of the main portion 310. The inactive element 3 only include the vertical conduction path. The second surface 312 of the inactive element 3 may contact the release layer 93 of the second carrier 92.

Referring to FIG. 21, an encapsulant 27 may be formed on the release layer 93 of the second carrier 92 to encapsulate the semiconductor device 20 (including, e.g., the first semiconductor device 25 and the second semiconductor device 26) and the inactive element 3 (e.g., the first inactive element 31 and the second inactive element 32). The encapsulant 27 may be disposed in the space 281, the space 282 and the space 283.

Then, a grinding process may be conducted to form the second molded structure 2 on the second carrier 92. The second molded structure 2 may include the semiconductor device 20, the inactive element 3 and the encapsulant 27. The second molded structure 2 may have a first surface 21 (e.g., a top surface) and a second surface 22 (e.g., a bottom surface) opposite to the first surface 21 (e.g., the top surface).

The encapsulant 27 may have a first surface 271 (e.g., a top surface) and a second surface 272 (e.g., a bottom surface) opposite to the first surface 271 (e.g., the top surface). The first surface 271 of the encapsulant 27 may be substantially coplanar with or aligned with the first surface 311 of the first inactive element 31 and the first surface 251 of the first semiconductor device 25. Thus, the first surface 21 of the second molded structure 2 may include the first surface 271 of the encapsulant 27, the first surface 311 of the first inactive element 31 and the first surface 251 of the first semiconductor device 25. In addition, the second surface 272 of the encapsulant 27 may be substantially coplanar with or aligned with the second surface 312 of the first inactive element 31 and the second surface 252 of the first semiconductor device 25. Thus, the second surface 22 of the second molded structure 2 may include the second surface 272 of the encapsulant 27, the second surface 312 of the first inactive element 31 and the second surface 252 of the first semiconductor device 25.

Figure 22:
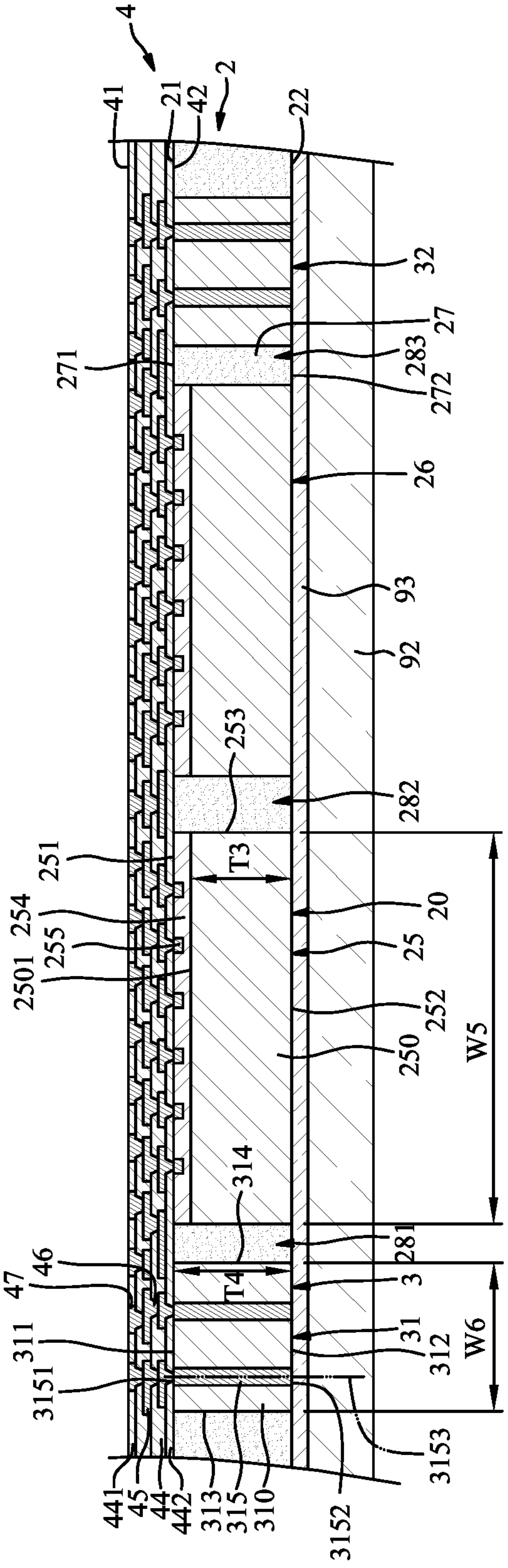

Referring to FIG. 22, a third redistribution structure 4 may be formed or disposed on the first surface 21 of the second molded structure 2. For example, the third redistribution structure 4 may be formed or disposed on the first surface 271 of the encapsulant 27, the first surface 311 of the first inactive element 31 and the first surface 251 of the first semiconductor device 25. The third redistribution structure 4 may be electrically connected to the semiconductor device 20 (e.g., the first semiconductor device 25 and the second semiconductor device 26) and through via 315 of the inactive element 3 (e.g., the first inactive element 31 and the second inactive element 32).

The third redistribution structure 4 may be a fan-out structure. The third redistribution structure 4 may have a first surface 41 (e.g., a top surface) and a second surface 42 (e.g., a bottom surface) opposite to the first surface 41 (e.g., the top surface). The second surface 42 of the third redistribution structure 4 may contact the first surface 21 of the second molded structure 2 directly.

The third redistribution structure 4 may include a plurality of dielectric layers 44, a plurality of circuit layers 45, a plurality of inner vias 46 and a plurality of pads 47. The material of the dielectric layers 44 may be the same with each other. In some embodiments, the material of the topmost dielectric layer 441 may be different from the material of the other dielectric layers 44. The topmost dielectric layer 441 may be a hybrid bonding (HB) dielectric layer. In some embodiments, the bottommost dielectric layer 442 may be omitted. The circuit layers 45 may be disposed on the first surface 21 of the second molded structure 2 directly.

The circuit layers 45 may be covered by or embedded in the dielectric layers 44. The circuit layers 45 may be fan-out circuit layers. The inner vias 46 may be embedded in the dielectric layers 44, and may connect adjacent two of the circuit layers 45. The inner vias 46 may taper toward the second molded structure 2. The pads 47 may be electrically connected to the circuit layers 45, and embedded in the dielectric layers 44 (e.g., the topmost dielectric layer 441). The pads 47 may be exposed from the first surface 41 of the third redistribution structure 4. Each of the pads 47 may be a hybrid bonding (HB) pad.

Figure 23:
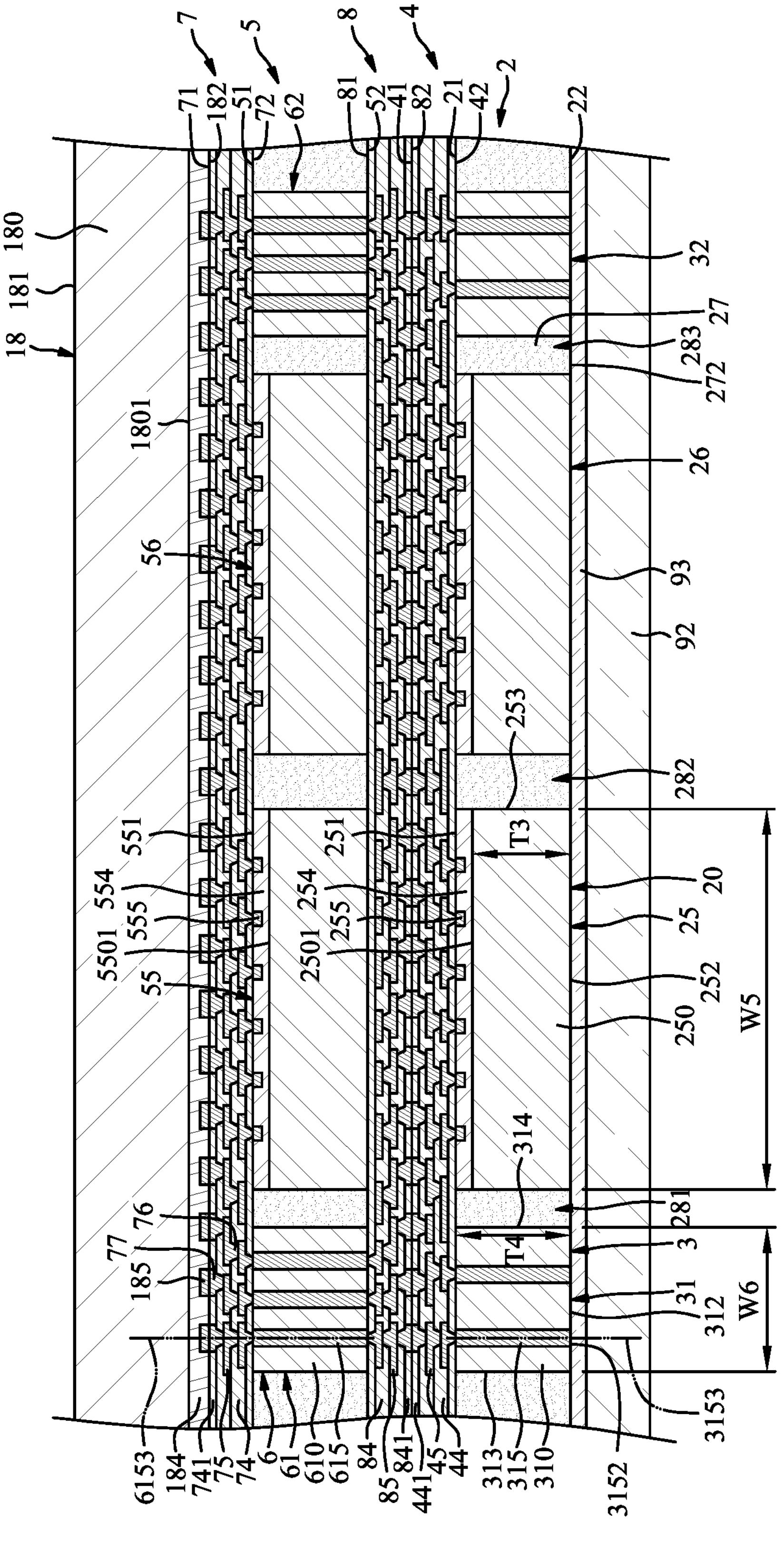

Referring to FIG. 23, the upper electronic device 18 and the first molded structure 5 may be attached to and electrically connected to the second molded structure 2 by hybrid bonding. That is, the second surface 82 of the second redistribution structure 8 may contact the first surface 41 of the third redistribution structure 4 directly. Thus, the pads 87 of the second redistribution structure 8 may be attached to, may connect to and may contact the pads 47 of the third redistribution structure 4 directly.

Figure 24:
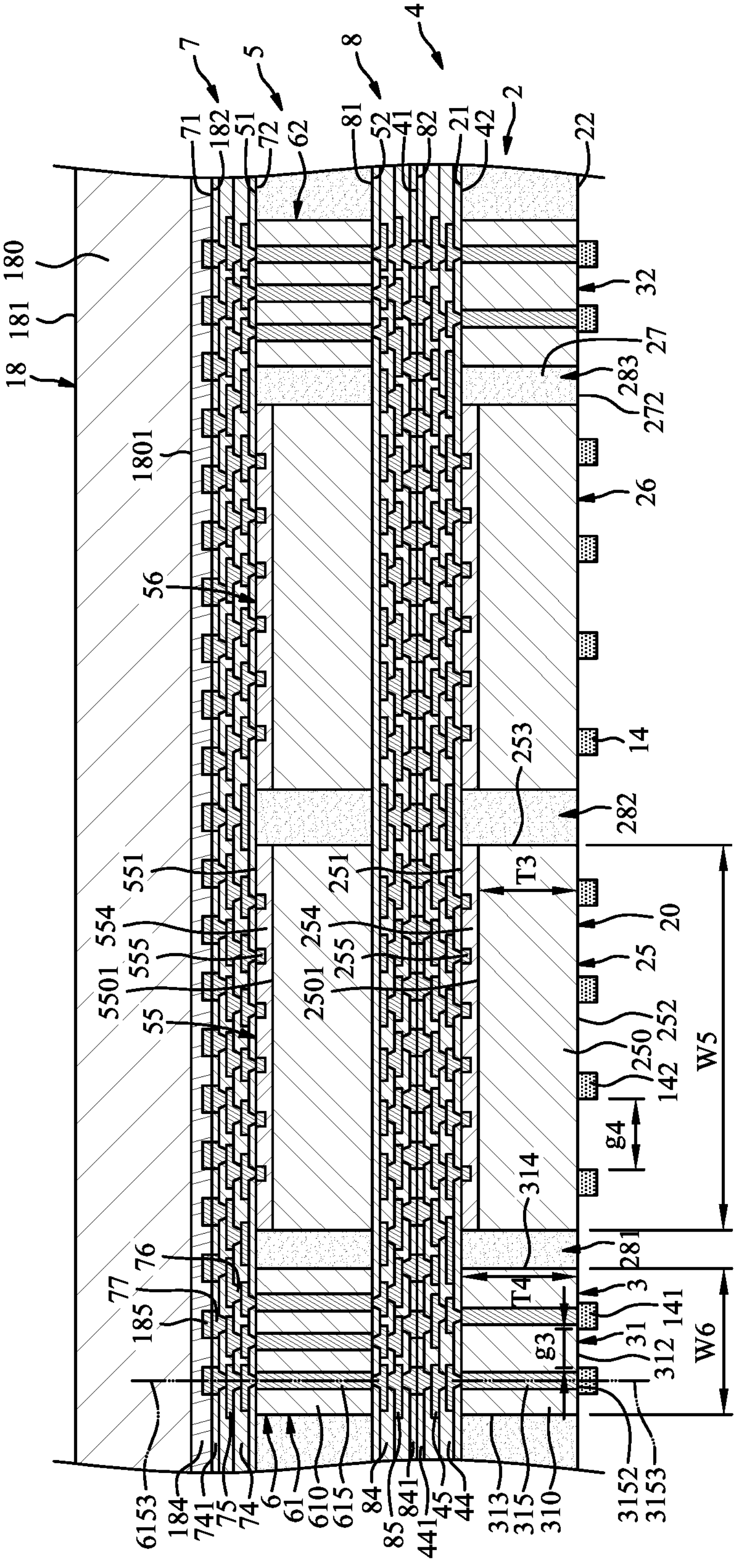

Referring to FIG. 24, the release layer 93 and the second carrier 92 may be removed from the second molded structure 2. Then, a grinding process may be conducted to the second surface 22 of the second molded structure 2. Then, a plurality of bumps 14 may be formed or disposed on the second surface 22 of the second molded structure 2. For example, the bumps 14 may include a plurality of first bumps 141 and a plurality of second bumps 142. The first bumps 141 may be formed or disposed on the second surface 3152 (e.g., the bottom surface) of the through via 315. The second bumps 142 may be formed or disposed on the second surface of the semiconductor device 20 (e.g., the second surface 252 of the first semiconductor device 25). In some embodiments, the first bumps 141 and the second bumps 142 may be formed concurrently at a same stage.

Figure 25:
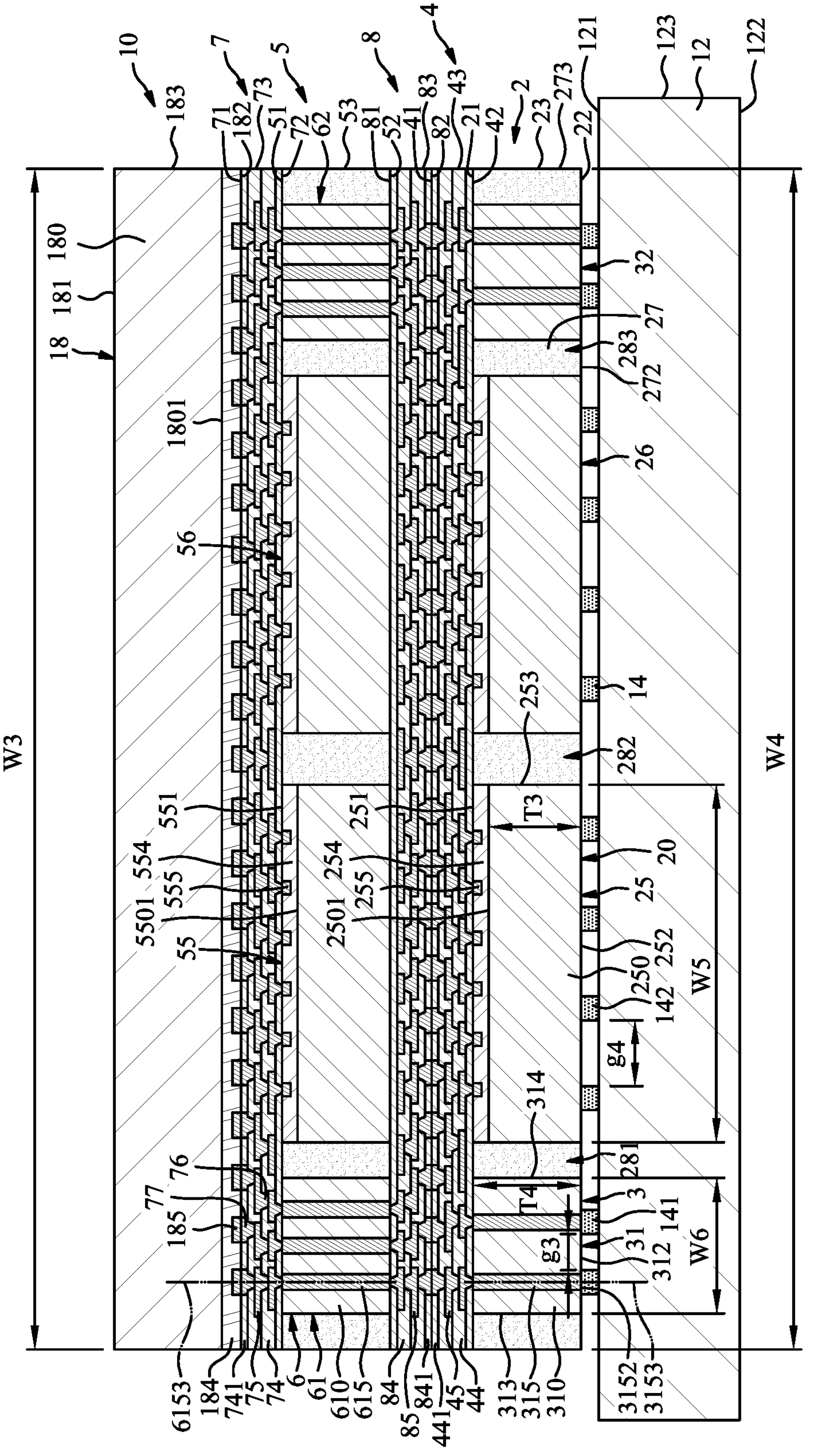

Referring to FIG. 25, the second molded structure 2, the third redistribution structure 4, the second redistribution structure 8, the first molded structure 5, the first redistribution structure 7 and the upper electronic device 18 may be diced to form a package structure 10. Then, the bumps 14 (e.g., the first bumps 141 and the second bumps) may be attached to a substrate 12. Thus, the package structure 10 may be attached to the substrate 12 through the bumps 14 (e.g., the first bumps 141 and the second bumps).

Then, a plurality of external connectors 16 may be formed or disposed on a second surface 122 of the substrate 12 to provide electrical connections, for example, I/O connections, of the substrate 12. Therefore, the assembly structure 1 of FIG. 1 is obtained.

Figure 26:
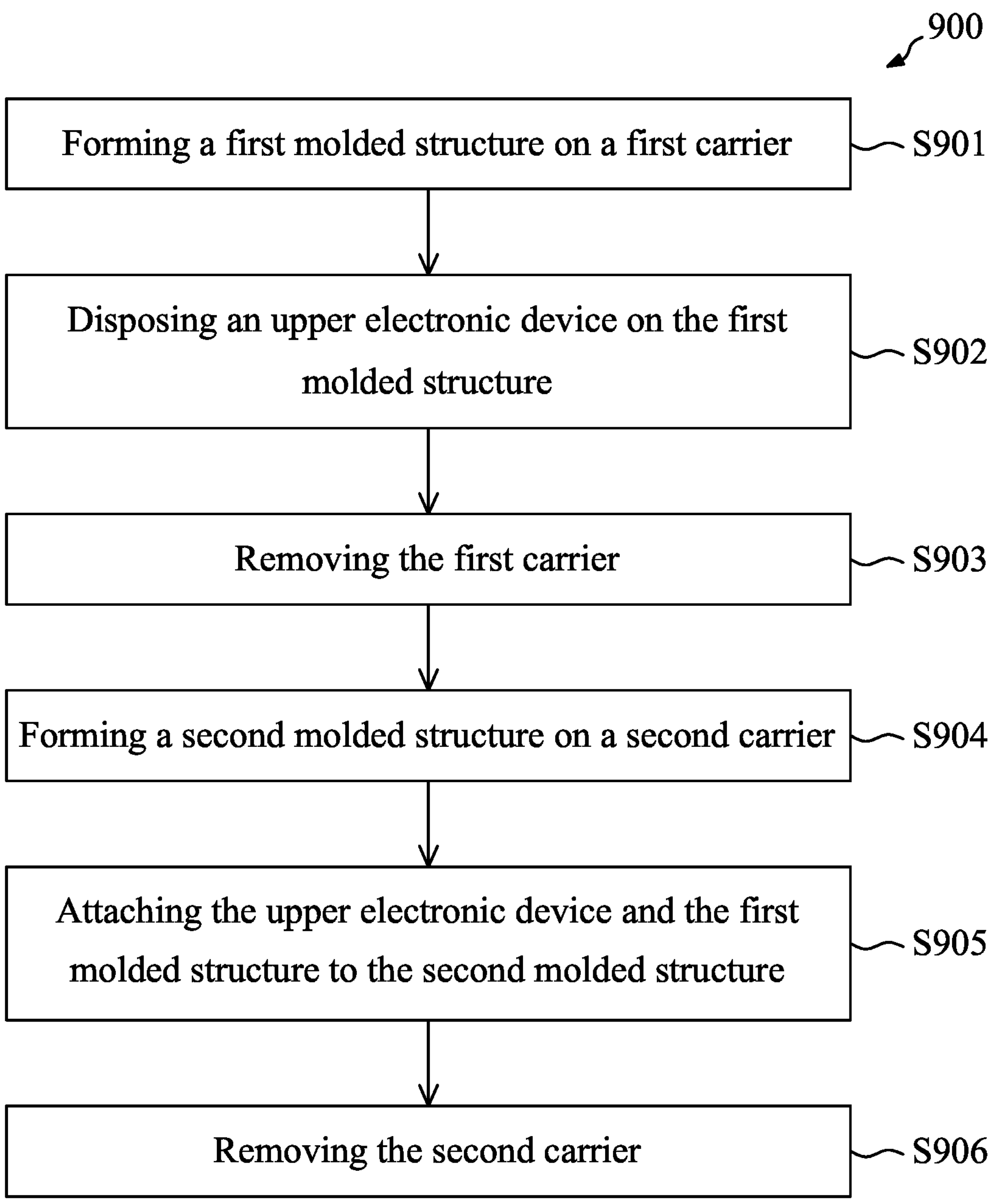
FIG. 26 is a flowchart of a method of manufacturing an assembly structure, in accordance with some embodiments of the present disclosure.

FIG. 26 illustrates a flow chart of a method 900 of manufacturing an assembly structure 1 in accordance with some embodiments of the present disclosure.

In some embodiments, the method 900 may include a step S901, forming a first molded structure on a first carrier. For example, as shown in FIG. 15, a first molded structure 5 may be formed on a first carrier 70.

In some embodiments, the method 900 may include a step S902, disposing an upper electronic device on the first molded structure. For example, as shown in FIG. 17, an upper electronic device 18 may be disposed on the first molded structure 5.

In some embodiments, the method 900 may include a step S903, removing the first carrier. For example, as shown in FIG. 18, the first carrier 90 may be removed.

In some embodiments, the method 900 may include a step S904, forming a second molded structure on a second carrier. For example, as shown in FIG. 21, a second molded structure 2 may be formed on a second carrier 92.

In some embodiments, the method 900 may include a step S905, attaching the upper electronic device and the first molded structure to the second molded structure. For example, as shown in FIG. 23, the upper electronic device 18 and the first molded structure 5 may be attached to the second molded structure 2.

In some embodiments, the method 900 may include a step S906, removing the second carrier. For example, as shown in FIG. 24, the second carrier 92 may be removed.

One aspect of the present disclosure provides an electronic device including a first semiconductor chip, a second semiconductor chip and a third semiconductor chip. The second semiconductor chip is stacked on the first semiconductor chip, and is electrically connected to the first semiconductor chip by hybrid bonding. The third semiconductor chip is stacked on the second semiconductor chip, and is electrically connected to the second semiconductor chip through a plurality of bumps.

Another aspect of the present disclosure provides an electronic device including a first assembly and a second assembly. The first assembly includes a first semiconductor chip and a second semiconductor chip stacked on the first semiconductor chip and electrically connected to the first semiconductor chip by hybrid bonding. The second assembly includes a third semiconductor chip and a fourth semiconductor chip stacked on the third semiconductor chip and electrically connected to the third semiconductor chip by hybrid bonding. The second assembly is electrically connected to the first assembly through a plurality of bumps.

Another aspect of the present disclosure provides a manufacturing method. The manufacturing method includes providing a first assembly including a first semiconductor chip and a second semiconductor chip stacked on the first semiconductor chip and electrically connected to the first semiconductor chip by hybrid bonding; providing a second assembly including a third semiconductor chip and a fourth semiconductor chip stacked on the third semiconductor chip and electrically connected to the third semiconductor chip by hybrid bonding; and electrically connecting the second assembly to the first assembly through a plurality of bumps.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A package structure, comprising:

a first molded structure having a first surface and a second surface opposite to the first surface, and comprising:

at least one semiconductor device;

at least one inactive element disposed around the at least one semiconductor device, and including a main portion and a plurality of through vias extending through the main portion; and an encapsulant encapsulating the at least one semiconductor device and the at least one inactive element;

a first redistribution structure disposed on the first surface of the first molded structure; and a second redistribution structure disposed on the second surface of the first molded structure, and electrically connected to the first redistribution structure through the at least one of the plurality of through vias of the at least one inactive element;

wherein the at least one semiconductor device comprises a main portion and an active circuit structure disposed on a top surface of the main portion to define the first surface of the first molded structure at a top surface of the active circuit structure and the second surface of the first molded structure at a bottom surface of the main portion;

wherein a thickness of the main portion of the at least one semiconductor device is less than a thickness of the main portion of the at least one inactive element;

wherein the thickness of the main portion of the at least one semiconductor device is defined by a distance between a top surface of the main portion of the at least one semiconductor device and the bottom surface thereof;

wherein the thickness of the main portion of the at least one inactive element is defined by a distance between a first surface of the main portion of the at least one inactive element and a second surface thereof.

2. The package structure of claim 1, wherein a first surface of the encapsulant of the first molded structure is substantially coplanar with a first surface of the main portion of the at least one inactive element of the first molded structure and is coplanar with the top surface of the active circuit structure of the at least one semiconductor device of the first molded structure, wherein a second surface of the encapsulant of the first molded structure is substantially coplanar with a second surface of the main portion of the at least one inactive element of the first molded structure and is coplanar with the bottom surface of the main portion of the at least one semiconductor device of the first molded structure;

wherein a thickness of the encapsulant, which is defined by a distance between the first surface and the second surface of the encapsulant, is equal to an overall thickness of the main portion and an active circuit structure of the at least one semiconductor device.

3. The package structure of claim 1, wherein a width of the main portion of the at least one semiconductor device is equal to a width of the active circuit structure of the at least one semiconductor device.

4. The package structure of claim 3, wherein a material of the main portion of the at least one semiconductor device of the first molded structure is same as a material of the main portion of the at least one inactive element of the first molded structure.

5. The package structure of claim 3, wherein the active circuit structure of the at least one semiconductor device of the first molded structure includes at least one pad embedded in the active circuit structure and exposed from the first surface of the at least one semiconductor device of the first molded structure.

6. The package structure of claim 3, wherein the at least one semiconductor device of the first molded structure does not include a vertical conduction path in the main portion of the at least one semiconductor device of the first molded structure.

7. The package structure of claim 1, wherein the at least one inactive element of the first molded structure does not include a horizontal conduction path on the main portion of the at least one inactive element of the first molded structure.

8. The package structure of claim 1, wherein a first surface of at least one of the plurality of through vias of the at least one inactive element of the first molded structure is exposed from the first surface of the at least one inactive element of the first molded structure, and a second surface of at least one of the plurality of through vias of the at least one inactive element is exposed from the second surface of the at least one inactive element of the first molded structure.

9. The package structure of claim 1, wherein the at least one semiconductor device of the first molded structure includes a first semiconductor device and a second semiconductor device disposed side by side, and the at least one inactive element of the first molded structure includes a first inactive element and a second inactive element disposed around the first semiconductor device and the second semiconductor device.

10. The package structure of claim 9, wherein the encapsulant of the first molded structure is disposed in a space between the first semiconductor device and the first inactive element, in a space between the first semiconductor device and the second semiconductor device, and in a space between the second semiconductor device and the second inactive element.

11. The package structure of claim 1, further comprising:

a second molded structure disposed under the first molded structure, and comprising:

at least one semiconductor device;

at least one inactive element disposed around the at least one semiconductor device, and including a main portion and a plurality of through vias extending through the main portion; and an encapsulant encapsulating the at least one semiconductor device and the at least one inactive element; and a third redistribution structure disposed between the first molded structure and the second molded structure;

wherein the conductive vias of the first molded structure are misaligned with the conductive vias of the second molded structure;

wherein the first molded structure is attached to and electrically connected to the second molded structure by hybrid bonding that a second surface of the second redistribution structure is in direct contact with a first surface of the third redistribution structure.

12. The package structure of claim 11, wherein a first surface of the encapsulant of the second molded structure is substantially coplanar with a first surface of the at least one inactive element of the second molded structure and a first surface of the at least one semiconductor device of the second molded structure, and a second surface of the encapsulant of the second molded structure is substantially coplanar with a second surface of the at least one inactive element of the second molded structure and a second surface of the at least one semiconductor device of the second molded structure, wherein a gap between the conductive vias of the first molded structure is different from a gap between the conductive vias of the second molded structure.

13. The package structure of package structure of claim 1, further comprising:

an upper electronic device disposed over and electrically connected to the first redistribution structure.

* * * * *